United States Patent
Pi et al.

(10) Patent No.: US 8,255,761 B1
(45) Date of Patent: Aug. 28, 2012

(54) METHODS AND APPARATUS TO COMPUTE CRC FOR MULTIPLE CODE BLOCKS

(75) Inventors: Zhouyue Pi, Richardson, TX (US); Farooq Khan, Allen, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/482,695

(22) Filed: May 29, 2012

Related U.S. Application Data

(63) Continuation of application No. 12/076,777, filed on Mar. 21, 2008.

(51) Int. Cl.
*G06F 11/00* (2006.01)
(52) U.S. Cl. ........................... 714/752; 714/758
(58) Field of Classification Search .................. 714/752, 714/758
See application file for complete search history.

(56) References Cited

U.S. PATENT DOCUMENTS

| | | | |
|---|---|---|---|
| 6,173,431 B1 * | 1/2001 | Rittle | 714/778 |
| 7,793,194 B2 * | 9/2010 | Seo et al. | 714/776 |
| 8,205,143 B2 * | 6/2012 | Buckley et al. | 714/781 |
| 2003/0123409 A1 * | 7/2003 | Kwak et al. | 370/335 |
| 2004/0187062 A1 | 9/2004 | Kajita | |
| 2006/0018279 A1 | 1/2006 | Agrawal et al. | |
| 2008/0192856 A1 | 8/2008 | Jongren et al. | |
| 2008/0225965 A1 * | 9/2008 | Pi et al. | 375/260 |
| 2009/0199066 A1 * | 8/2009 | Kim et al. | 714/752 |
| 2009/0303913 A1 | 12/2009 | Yu et al. | |
| 2011/0261775 A1 * | 10/2011 | Kim et al. | 370/329 |

OTHER PUBLICATIONS

Office Action dated Jun. 13, 2012 in connection with U.S. Appl. No. 12/039,645.

* cited by examiner

*Primary Examiner* — Marc Duncan

(57) ABSTRACT

A method and a circuit for generating cyclic redundancy checks. The method calculates a plurality of cyclic redundancy checks for a transport block with a plurality of information bits. At least one cyclic redundancy check among the plurality of cyclic redundancy checks is calculated based on a subset of information bits, and at least one information bit among the plurality of information bits is not within said subset of the information bits. In addition, a transport block cyclic redundancy check may be calculated based on all the information bits.

23 Claims, 24 Drawing Sheets

FIG. 2  Orthogonal Frequency Division Multiplexing

METHODS AND APPARATUS TO COMPUTE CRC FOR MULTIPLE CODE BLOCKS

CLAIM OF PRIORITY

This application claims priority as a continuation of U.S. patent application Ser. No. 12/076,777 filed Mar. 21, 2008, entitled "METHODS AND APPARATUS TO COMPUTE CRC FOR MULTIPLE CODE BLOCKS." This application further claims priority to U.S. Provisional Patent Application Ser. No. 60/929,790 filed Jul. 12, 2007. The content of the above-identified patent documents is hereby incorporated by reference.

BACKGROUND OF THE INVENTION

1. Field of the Invention

The present invention relates to methods and apparatus to generate cyclic redundancy checks to multiple code blocks.

2. Description of the Related Art

A wireless communication system generally includes multiple base stations and multiple mobile stations, while a single base station often communicates with a set of mobile stations. The transmission from a base station to a mobile station is known as downlink communication. Likewise, the transmission from a mobile station to a base station is known as uplink communication. Both base stations and mobile stations may employ multiple antennas for transmitting and receiving radio wave signals. The radio wave signal may be either Orthogonal Frequency Division Multiplexing (OFDM) signals or Code Division Multiple Access (CDMA) signals. A mobile station may be either a PDA, laptop, or handheld device.

In a third Generation Partnership Project long term evolution (3GPP LTE) system, when a transport block is large, the transport block is segmented into multiple code blocks so that multiple coded packets can be generated, which is advantageous because of benefits such as enabling parallel processing or pipelining implementation and flexible trade off between power consumption and hardware complexity.

In a contemporary High Speed Data Shared Channel (HS-DSCH) design, only one 24-bit cyclic redundancy check (CRC) is generated for the whole transport block for the purpose of error detection for that block. If multiple code blocks are generated and transmitted in one transmission time interval (TTI), the receiver may correctly decode some of the code blocks but not the others. In that case, the receiver will feed back a non-acknowledgement (NAK) to the transmitter because the CRC for the transport block will not check.

SUMMARY OF THE INVENTION

It is therefore an object of the present invention to provide improved methods and apparatus for generating cyclic redundancy checks for multiple code blocks.

It is another object of the present invention to provide an improved method and apparatus for error detection.

According to one aspect of the present invention, a method for communication is provided. A plurality of cyclic redundancy checks are calculated for a plurality of information bits. At least one cyclic redundancy check among the plurality of cyclic redundancy checks is calculated based on a subset of information bits, and at least one information bit among the plurality of information bits is not within said subset of the information bits. The plurality of cyclic redundancy checks and the plurality of information bits are transmitted via a first node to a second node.

In response to the plurality of cyclic redundancy checks and the plurality of information bits received, the plurality of cyclic redundancy checks and the plurality of information bits are processed at the second node.

The subset of information bits may be jointly encoded by a certain type of forward error correcting code, such as a turbo code.

The subset of information bits and the at least one cyclic redundancy check that is calculated based on the subset of information bits may be jointly encoded.

A first cyclic redundancy check may be calculated for a first subset of information bits, and a second cyclic redundancy checks may be calculated for a second subset of information bits.

The first subset of information bits and the second subset of information bits may overlap with each other.

Alternatively, the first subset of information bits and the second subset of information bits may be separated from each other.

Still alternatively, the second subset of information bits may include the first subset of information bits.

At least one cyclic redundancy check among the plurality of cyclic redundancy checks may be calculated based on all of the information bits.

According to another aspect of the present invention, a method for communication is provided. At least one transport block of information bits are segmented into a plurality of code blocks. A plurality of code block cyclic redundancy checks are calculated for the plurality of code blocks, with at least one code block cyclic redundancy check being calculated based upon a corresponding code block. The plurality of code blocks and the plurality of code block cyclic redundancy checks are transmitted via a first node to a second node.

The bits in a code block selected from the plurality of code block may be jointly encoded using a certain type of forward error correcting code. In this case, a code block cyclic redundancy check is calculated based upon the jointly coded code block.

Each of the plurality of code block cyclic redundancy checks may be calculated based upon a corresponding one of the plurality of code blocks.

Each of the plurality of code block cyclic redundancy checks may be calculated based upon at least the corresponding one of the plurality of code blocks.

A transport block cyclic redundancy check may be calculated based on the transport block before segmenting the transport block.

The plurality of code blocks may include at least one code block from which no code block cyclic redundancy check is generated.

At least one code block cyclic redundancy check may be calculated based upon all of the plurality of code blocks.

According to yet another aspect of the present invention, a circuit for generating cyclic redundancy checks in data communications is provided with: an input port for receiving information data; an output port for outputting the information data and cyclic redundancy checks; a linear feedback shift register unit communicatively connected between the input port and the output port, and comprising L shift registers for transforming the information data with a cyclic redundancy check generation polynomial $g(x)$ having a degree of $L-1$; a cyclic redundancy check register unit communicatively connected between the input port and the linear feedback shift register unit, and comprising L cyclic redundancy check registers; a first switch communicatively connected between the input port and the cyclic redundancy check register unit; a second switch communicatively connected at a feedback loop of the linear feedback shift register unit; a third switch communicatively connected between the linear feedback shift register unit and the cyclic redundancy check register unit; and a fourth switch communicatively connected between the input port, the linear feedback shift register unit and the output port, and having a first position for connecting the input port and the output port, and a second position for connecting the linear feedback shift register unit and the output port.

The linear feedback shift register unit and the cyclic redundancy check register unit may be initialized to an all-zero state. The first switch may be set to connect the input port to the linear feedback shift register unit. The second switch may be set to connect the feedback loop of the linear feedback shift register unit. The third switch may be set to disconnect the linear feedback shift register unit and the cyclic redundancy check register unit. The fourth switch may be set to the first position to connect the input port with the output port. A code block of information data may be received via the input port. The first switch may be set to disconnect the input port and the linear feedback shift register unit. The second switch may be set to disconnect the feedback loop of the linear feedback shift register unit. The third switch may be set to connect the linear feedback shift register unit and the cyclic redundancy check register unit. The fourth switch may be set to the second position to connect the linear feedback shift register unit with the output port. The linear feedback shift register unit may be shifted L times to obtain the cyclic redundancy checks for the code block.

According to still another aspect of the present invention, a circuit for generating cyclic redundancy checks in data communications is provided with an input port for receiving information data; an output port for outputting the information data and cyclic redundancy checks; a linear feedback shift register unit communicatively connected between the input port and the output port, and comprising L shift registers for transforming the information data with a cyclic redundancy check generation polynomial g(x) having a degree of L−1; L state registers communicatively connected to corresponding ones of the L shift registers to write and read data values to and from the L shift registers; a first switch communicatively connected between the input port and the linear feedback shift register unit; a second switch communicatively connected at a feedback loop of the linear feedback shift register unit; and a third switch communicatively connected between the input port, the linear feedback shift register unit and the output port, and having a first position for connecting the input port with the output port, and a second position for connecting the linear feedback shift register unit and the output port.

The linear feedback shift register unit and the state registers may be initialized to an all-zero state. The first switch may be set to connect the input port to the linear feedback shift register unit. The second switch may be set to connect the feedback loop of the linear feedback shift register unit. The third switch may be set to the first position to connect the input port with the output port. A code block of information data may be received via the input port. The data values in the L shift registers in the feedback shift register unit are written to the respectively corresponding state registers. The first switch may be set to disconnect the input port and the linear feedback shift register unit. The second switch may be set to disconnect the feedback loop of the linear feedback shift register unit. The third switch may be set to the second position to connect the linear feedback shift register unit with the output port. The linear feedback shift register unit are shifted L times to obtain the cyclic redundancy checks for the code block. Then, the first switch may be set to connect the input port to the linear feedback shift register unit; the second switch may be set to connect the feedback loop of the linear feedback shift register unit; and the third switch may be set to the first position to connect the input port with the output port. The data values in the state registers are written to the respectively corresponding shift registers in the feedback shift register unit.

According to still yet another aspect of the present invention, a circuit for generating cyclic redundancy checks in data communications is provided with an input port for receiving information data; an output port for outputting the information data and cyclic redundancy checks; a first linear feedback shift register unit communicatively connected between the input port and the output port, and comprising L shift registers for transforming the information data with a cyclic redundancy check generation polynomial g(x) having a degree of L−1; a second linear feedback shift register unit communicatively connected between the input port and the output port being in parallel with the first linear feedback shift register unit, and comprising L shift registers for transforming the information data with a cyclic redundancy check generation polynomial g(x) having a degree of L−1; a first switch communicatively connected between the input port and a common node between the first and second linear feedback shift register units; a second switch communicatively connected at a feedback loop of the first linear feedback shift register unit; a third switch communicatively connected between the input port, the common node between the first and second linear feedback shift register units, and the output port, and having a first position for connecting the input port with the output port, a second position for connecting the first linear feedback shift register unit and the output port, and a third position for connecting the second linear feedback shift register unit and the output port; and a fourth switch communicatively connected at a feedback loop of the second linear feedback shift register unit.

The first and second linear feedback shift register units and the cyclic redundancy check register unit may be initialized to an all-zero state. The first switch may be set to connect the input port to the common node between the first and second linear feedback shift register units; the second switch may be set to connect the feedback loop of the first linear feedback shift register unit; the third switch may be set to the first position to connect the input port with the output port; and the fourth switch may be set to connect the feedback loop of the second linear feedback shift register unit. A code block of information data may be received via the input port. A determination is made regarding whether the received code block is the last code block of the information data. When the received code block is not the last code block of the information data, the first switch may be set to disconnect the input port and the linear feedback shift register unit; the second switch may be set to disconnect the feedback loop of the linear feedback shift register unit; and the third switch may be set to the second position to connect the first linear feedback shift register unit with the output port. The first linear feedback shift register unit may be shifted L times to obtain the cyclic redundancy checks for the code block.

When the received code block of information data is the last code block of the information data, the third switch may be set to the third position to connect the second linear feedback shift register unit with the output port; and the fourth switch may be set to disconnect the feedback loop of the linear feedback shift register unit. The second linear feedback shift register unit may be shifted L times to obtain the cyclic redundancy checks for the code block.

According to a further aspect of the present invention, a circuit for generating cyclic redundancy checks in data communications is provided with an input port for receiving information data; an output port for outputting the information data and cyclic redundancy checks; a linear feedback shift register unit communicatively connected between the input port and the output port, and comprising L shift registers for transforming the information data with a cyclic redundancy check generation polynomial g(x) having a degree of L−1; a first switch communicatively connected between the input port and the linear feedback shift register unit; a second switch communicatively connected at a feedback loop of the linear feedback shift register unit; and a third switch communicatively connected between the input port, the linear feedback shift register unit and the output port, and having a first position for connecting the input port with the output port, and a second position for connecting the linear feedback shift register unit and the output port.

The linear feedback shift register unit may be initialized to an all-zero state. The first switch may be set to connect the input port to the linear feedback shift register unit; the second switch may be set to connect the feedback loop of the linear feedback shift register unit; and the third switch may be set to the first position to connect the input port with the output port. A code block of information data may be received via the input port. The first switch may be set to disconnect the input port and the linear feedback shift register unit; the second switch may be set to disconnect the feedback loop of the linear feedback shift register unit; and the third switch may be set to the second position to connect the linear feedback shift register unit with the output port. The linear feedback shift register unit may be shifted L times to obtain the cyclic redundancy checks for the code block.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
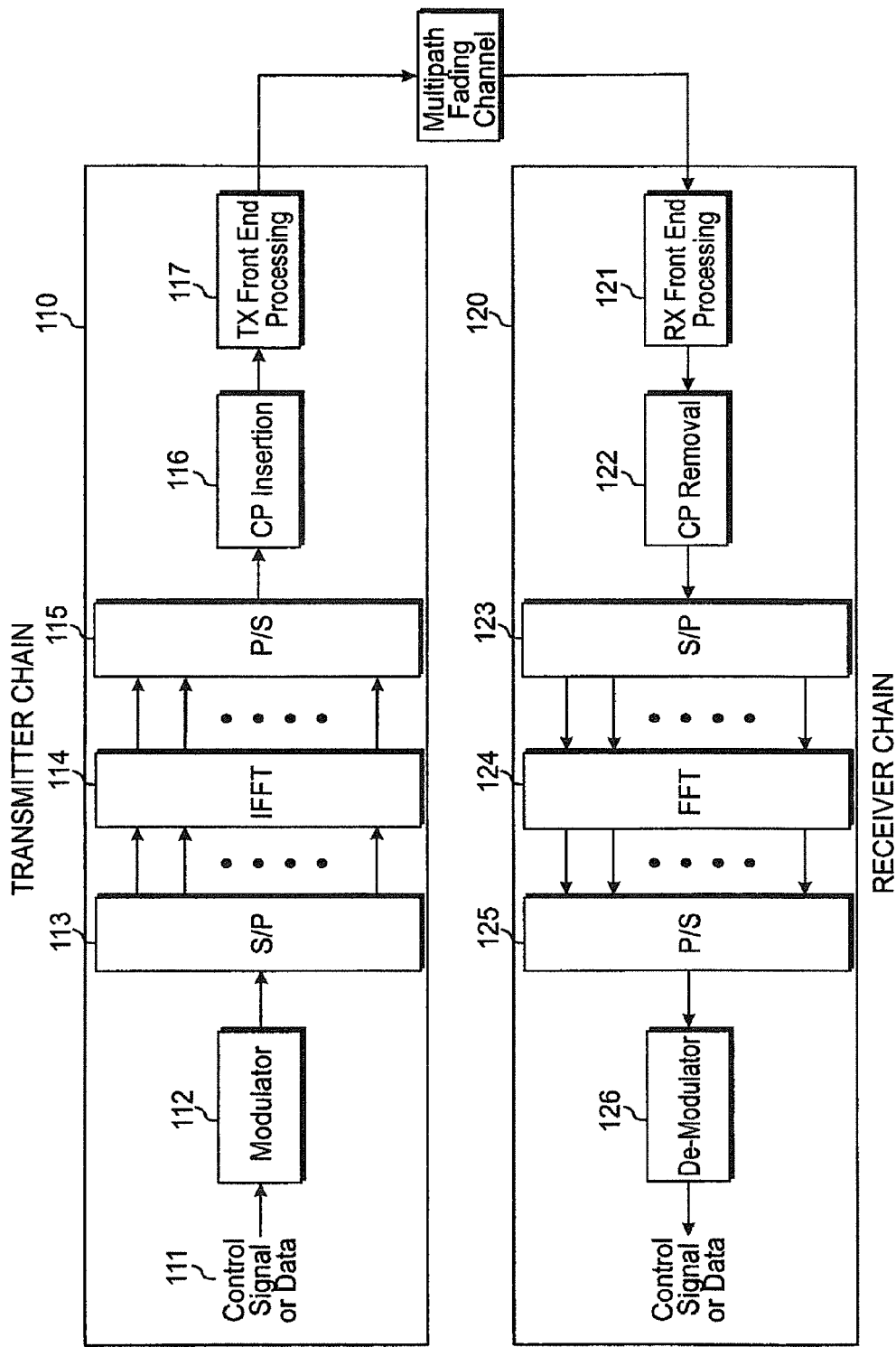
FIG. 1 is an illustration of an Orthogonal Frequency Division Multiplexing (OFDM) transceiver chain suitable for the practice of the principles of the present invention.

Orthogonal Frequency Division Multiplexing (OFDM) is a technology to multiplex data in frequency domain. Modulation symbols are carried on frequency sub-carriers. FIG. 1 illustrates an Orthogonal Frequency Division Multiplexing (OFDM) transceiver chain. In a communication system using OFDM technology, at transmitter chain 110, control signals or data 111 is modulated by modulator 112 into a series of modulation symbols, that are subsequently serial-to-parallel converted by Serial/Parallel (S/P) converter 113. Inverse Fast Fourier Transform (IFFT) unit 114 is used to transfer the signals from frequency domain to time domain into a plurality of OFDM symbols. Cyclic prefix (CP) or zero prefix (ZP) is added to each OFDM symbol by CP insertion unit 116 to avoid or mitigate the impact due to multipath fading. Consequently, the signal is transmitted by transmitter (Tx) front end processing unit 117, such as an antenna (not shown), or alternatively, by fixed wire or cable. At receiver chain 120, assuming perfect time and frequency synchronization are achieved, the signal received by receiver (Rx) front end processing unit 121 is processed by CP removal unit 122. Fast Fourier Transform (FFT) unit 124 transfers the received signal from time domain to frequency domain for further processing.

Figure 2:
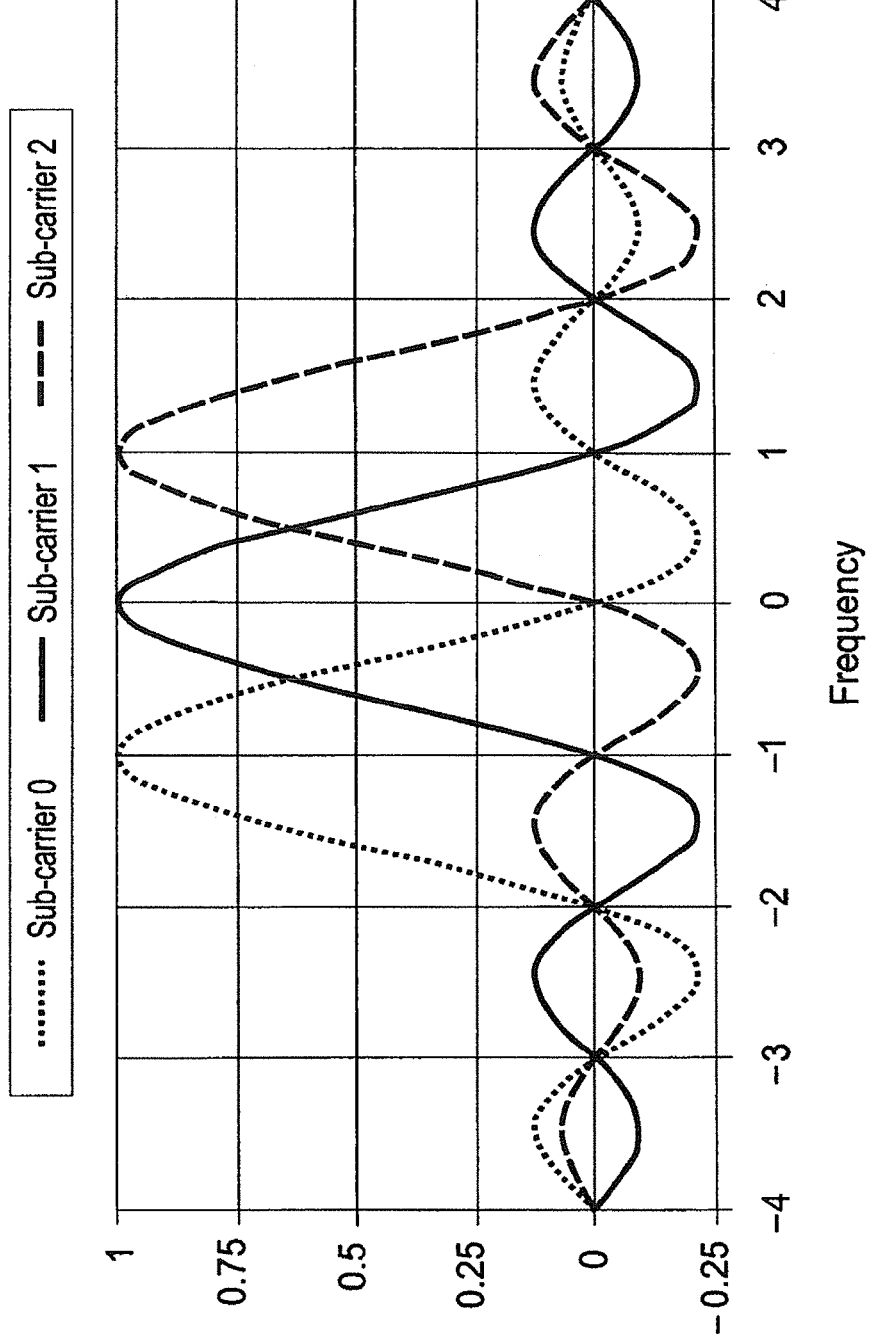
FIG. 2 is two coordinate graphs of OFDM subcarriers showing amplitude as a function of frequency.

In a OFDM system, each OFDM symbol consists of multiple sub-carriers. Each sub-carrier within an OFDM symbol carriers a modulation symbol. FIG. 2 illustrates the OFDM transmission scheme using sub-carrier 1, sub-carrier 2, and sub-carrier 3. Because each OFDM symbol has finite duration in time domain, the sub-carriers overlap with each other in frequency domain. The orthogonality is, however, maintained at the sampling frequency assuming the transmitter and the receiver has perfect frequency synchronization, as shown in FIG. 2. In the case of frequency offset due to imperfect frequency synchronization or high mobility, the orthogonality of the sub-carriers at sampling frequencies is destroyed, resulting in inter-carrier-interference (ICI).

Figure 3:
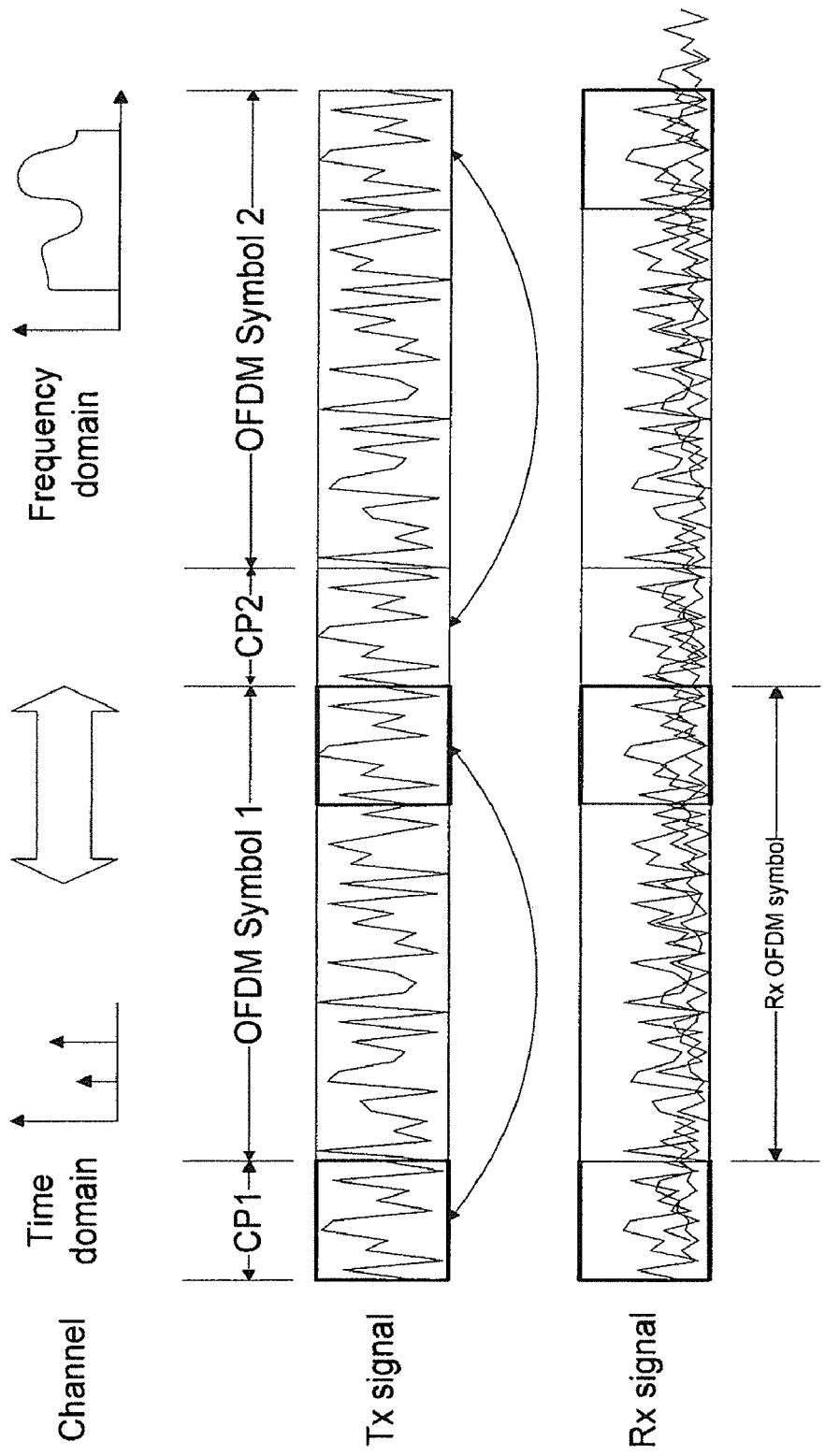
FIG. 3 is an illustration of the waveforms for OFDM symbols in a time domain.

A time domain illustration of the transmitted and received OFDM symbols is shown in FIG. 3. Due to multipath fading, the CP portion of the received signal is often corrupted by the previous OFDM symbol. As long as the CP is sufficiently long, the received OFDM symbol without CP should, however, only contain its own signal convoluted by the multipath fading channel. In general, a Fast Fourier Transform (FFT) is taken at the receiver side to allow further processing frequency domain. The advantage of OFDM over other transmission schemes is its robustness to multipath fading. The multipath fading in time domain translates into frequency selective fading in frequency domain. With the cyclic prefix or zero prefix added, the inter-symbol-interference between adjacent OFDM symbols are avoided or largely alleviated. Moreover, because each modulation symbol is carried over a narrow bandwidth, it experiences a single path fading. Simple equalization scheme can be used to combat frequency selection fading.

Figure 4:
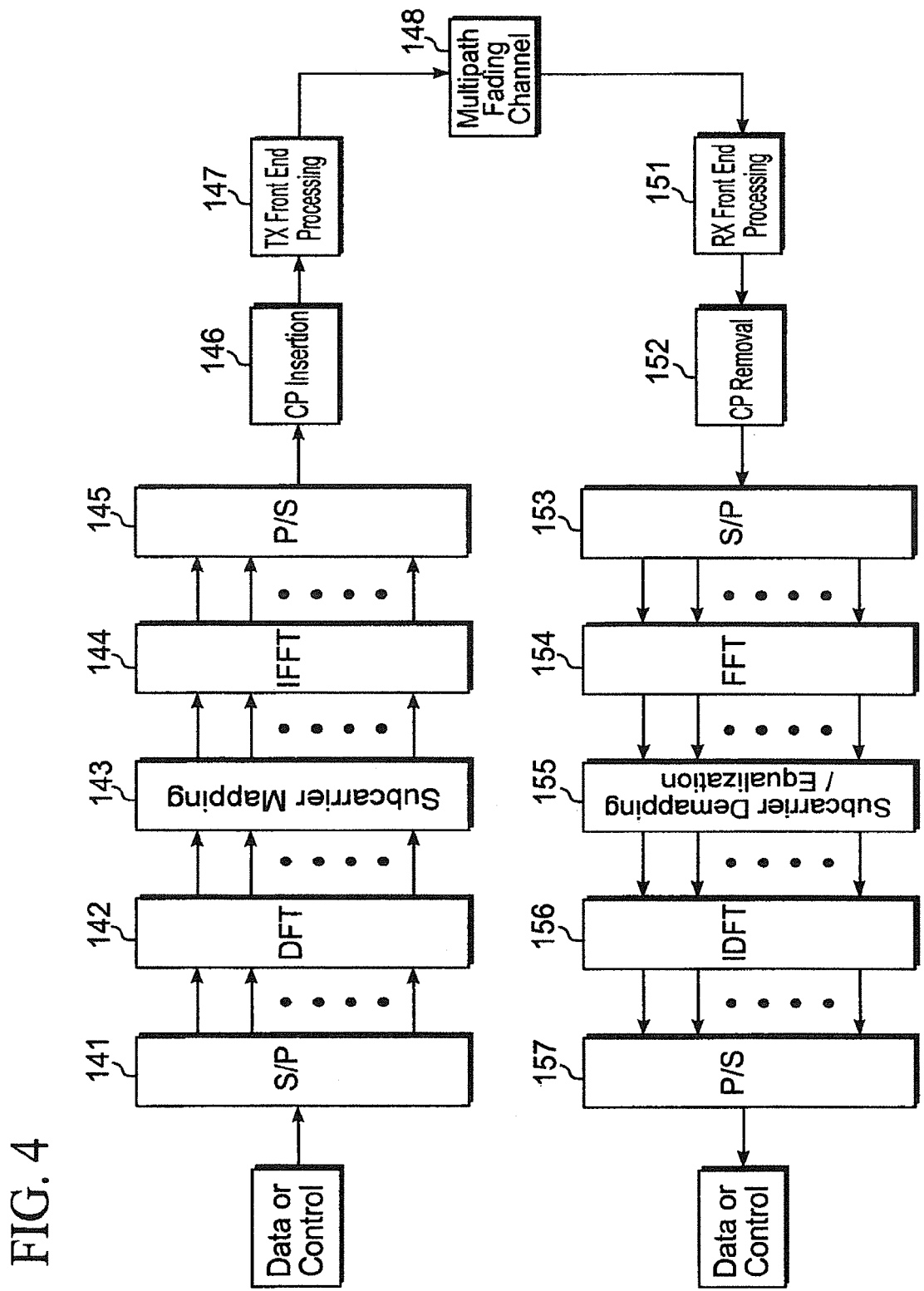
FIG. 4 is an illustration of single carrier frequency division multiple access transceiver chain.
Figure 5:
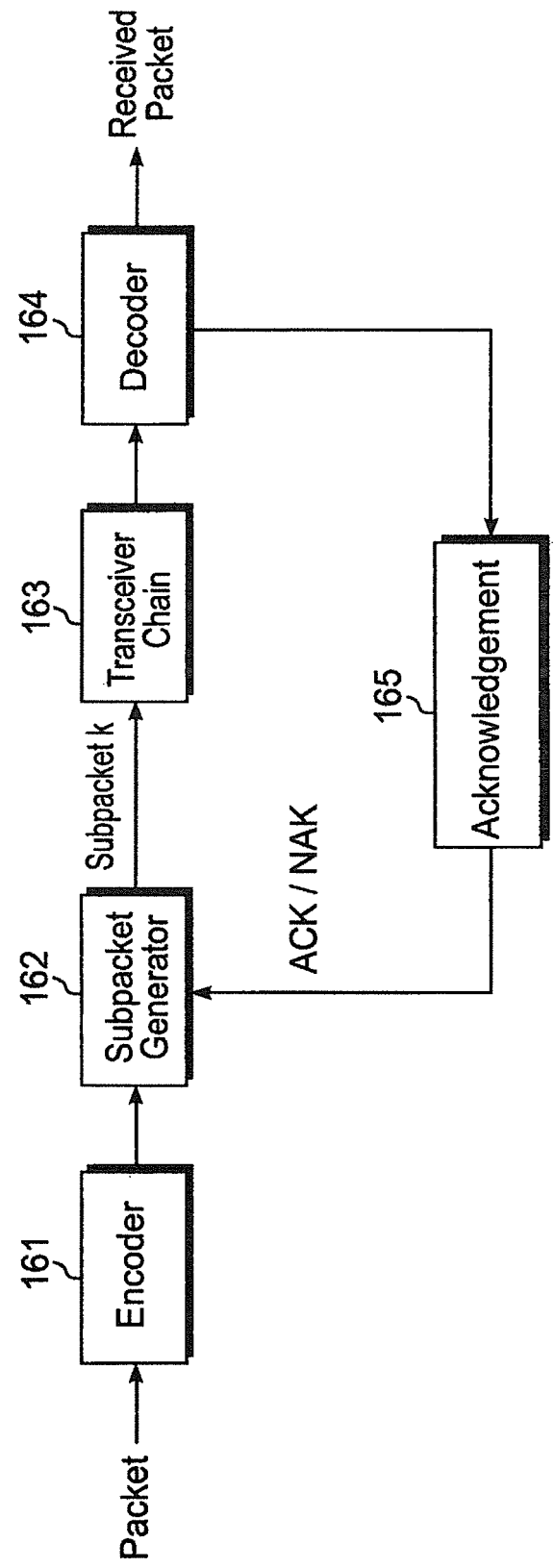
FIG. 5 schematically shows a Hybrid Automatic Repeat request (HARQ) transceiver chain.

Single carrier frequency division multiple access (SC-FDMA), which utilizes single carrier modulation and frequency domain equalization is a technique that has similar performance and complexity as those of an OFDMA system. One advantage of SC-FDMA is that the SC-FDMA signal has lower peak-to-average power ratio (PAPR) because of its inherent single carrier structure. Low PAPR normally results in high efficiency of power amplifier, which is particularly important for mobile stations in uplink transmission. SC-FDMA is selected as the uplink multiple access scheme in 3GPP long term evolution (LTE). An example of the transceiver chain for SC-FDMA is shown in FIG. 4. At the transmitter side, the data or control signal is serial to parallel (S/P) converted by a S/P convertor 181. Discrete Fourier transform (DFT) will be applied to time-domain data or control signal by a DFT transformer 182 before the time-domain data is mapped to a set of sub-carriers by a sub-carrier mapping unit 183. To ensure low PAPR, normally the DFT output in the frequency domain will be mapped to a set of contiguous sub-carriers. Then IFFT, normally with larger size than the DFT, will be applied by an IFFT transformer 184 to transform the signal back to time domain. After parallel to serial (P/S) convertion by a P/S/converter 185, cyclic prefix (CP) will be added by a CP insertion unit 186 to the data or the control signal before the data or the control signal is transmitted to a transmission front end processing unit 187. The processed signal with a cyclic prefix added is often referred to as a SC-FDMA block. After the signal passes through a communication channel 188, e.g., a multipath fading channel in a wireless communication system, the receiver will perform receiver front end processing by a receiver front end processing unit 191, remove the CP by a CP removal unit 192, apply FFT by a FFT transformer 194 and frequency domain equalization. Inverse Discrete Fourier transform (IDFT) 196 will be applied after the equalized signal is demapped 195 in frequency domain. The output of IDFT will be passed for further time-domain processing such as demodulation and decoding.

In packet-based wireless data communication systems, control signals transmitted through control channels, i.e., control channel transmission, generally accompany data signals transmitted through data channels, i.e., data transmission. Control channel information, including control channel format indicator (CCFI), acknowledgement signal (ACK), packet data control channel (PDCCH) signal, carries transmission format information for the data signal, such as user ID, resource assignment information, Payload size, modulation, Hybrid Automatic Repeat-reQuest (HARQ) information, MIMO related information.

Hybrid Automatic Repeat reQuestion (HARQ) is widely used in communication systems to combat decoding failure and improve reliability. Each data packet is coded using certain forward error correction (FEC) scheme. Each subpacket may only contains a portion of the coded bits. If the transmission for subpacket k fails, as indicated by a NAK in a feedback acknowledgement channel, a retransmission subpacket, subpacket k+1, is transmitted to help the receiver decode the packet. The retransmission subpackets may contain different coded bits than the previous subpackets. The receiver may softly combine or jointly decode all the received subpackets to improve the chance of decoding. Normally, a maximum number of transmissions is configured in consideration of both reliability, packet delay, and implementation complexity.

Figure 6:
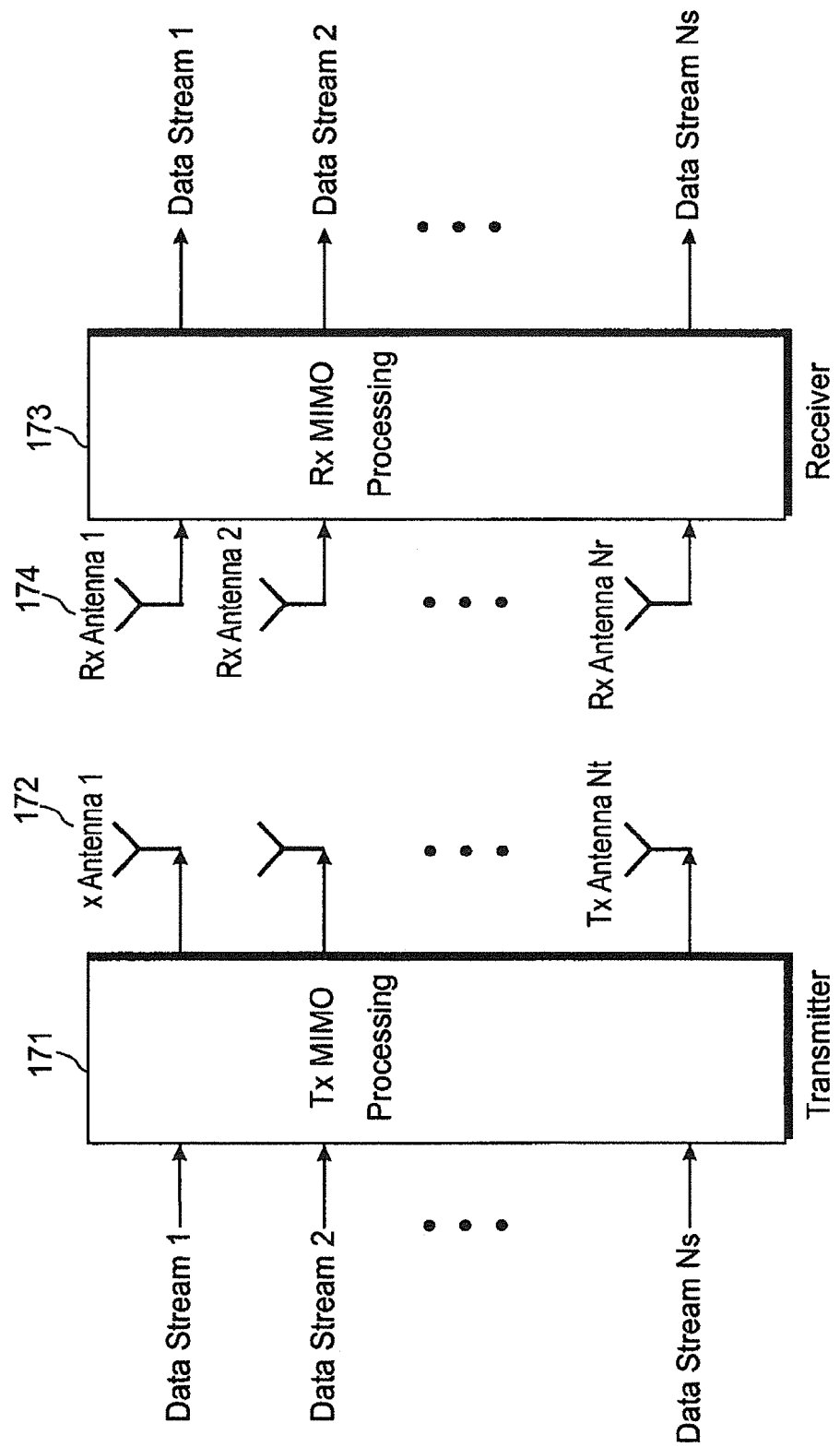
FIG. 6 schematically shows a Multiple Input Multiple Output (MIMO) system.

Multiple antenna communication systems, which is often referred to as multiple input multiple output (MIMO), are widely used in wireless communication to improve system performance. In a MIMO system shown in FIG. 6, the transmitter has multiple antennas capable of transmitting independent signals and the receiver is equipped with multiple receive antennas. MIMO systems degenerates to single input multiple output (SIMO) if there is only one transmission antenna or if there is only one stream of data transmitted. MIMO systems degenerates to multiple input single output (MISO) if there is only one receive antenna. MIMO systems degenerates to single input single output (SISO) if there is only one transmission antenna and one receive antenna. MIMO technology can significant increase throughput and range of the system without any increase in bandwidth or overall transmit power. In general, MIMO technology increases the spectral efficiency of a wireless communication system by exploiting the additional dimension of freedom in the space domain due to multiple antennas. There are many categories of MIMO technologies. For example, spatial multiplexing schemes increase the transmission rate by allowing multiple data streaming transmitted over multiple antennas. Transmit diversity methods such as space-time coding take advantage of spatial diversity due to multiple transmit antennas. Receiver diversity methods utilizes the spatial diversity due to multiple receive antennas. Beamforming technologies improve received signal gain and reducing interference to other users. Spatial division multiple access (SDMA) allows signal streams from or to multiple users to be transmitted over the same time-frequency resources. The receivers can separate the multiple data streams by the spatial signature of these data streams. Note these MIMO transmission techniques are not mutually exclusive. In fact, many MIMO schemes are often used in an advanced wireless systems.

Figure 7:
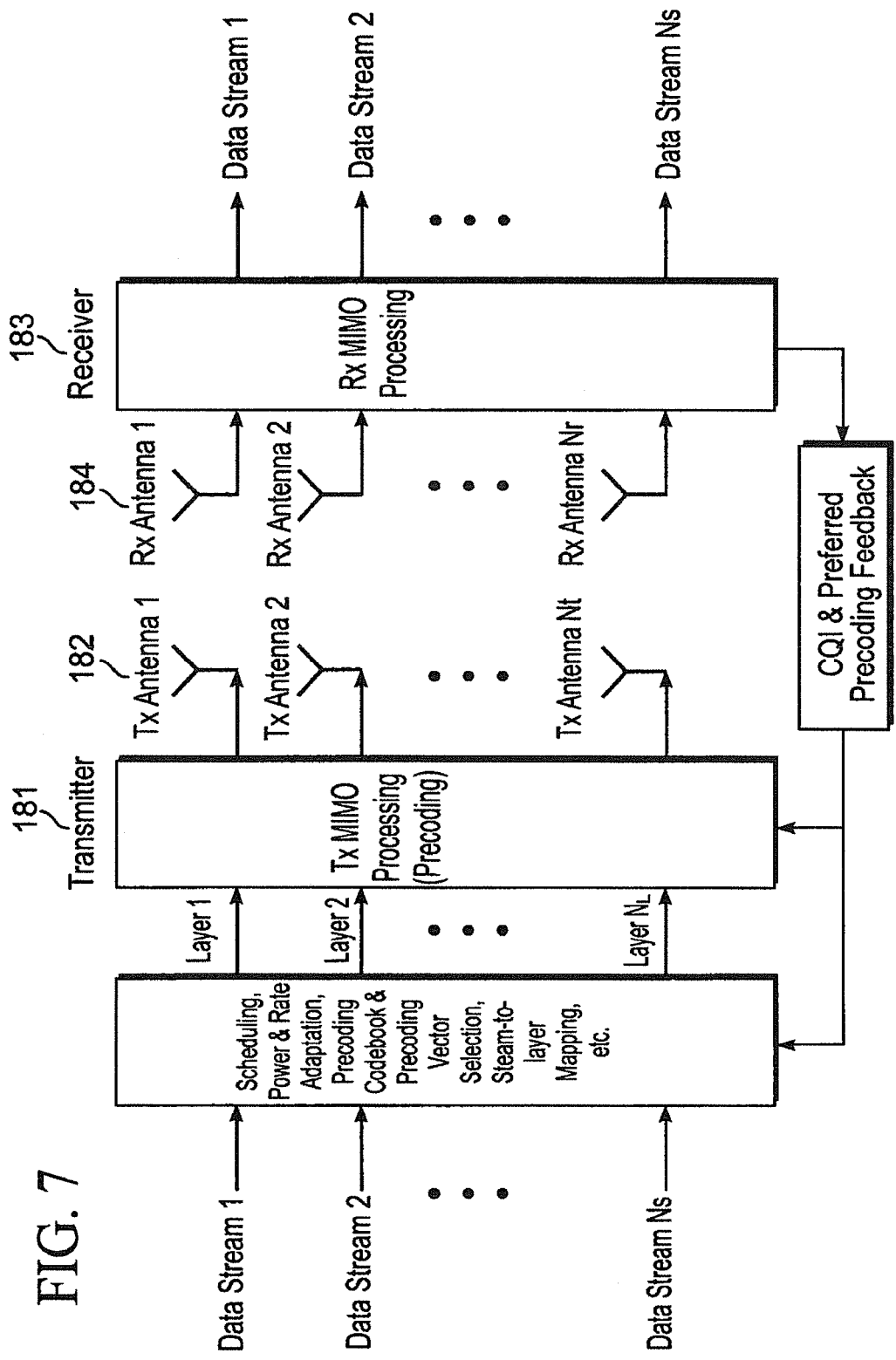
FIG. 7 schematically shows a precoded MIMO system.

When the channel is favorable, e.g., the mobile speed is low, it is possible to use closed-loop MIMO scheme to improve system performance. In a closed-loop MIMO systems, the receivers feedback the channel condition and/or preferred Tx MIMO processing schemes. The transmitter utilizes this feedback information, together with other considerations such as scheduling priority, data and resource availability, to jointly optimize the transmission scheme. A popular closed loop MIMO scheme is called MIMO precoding. With precoding, the transmit data streams are pre-multiplied by a matrix before being passed on to the multiple transmit antennas. As shown in FIG. 7, assume there are Nt transmit antennas and Nr receive antennas. Denote the channel between the Nt transmit antennas and the Nr receive antennas as H. Therefore H is an Nt×Nr matrix. If the transmitter has knowledge about H, the transmitter can choose the most advantageous transmission scheme according to H. For example, if maximizing throught is the goal, the precoding matrix can be chosen to be the right singluar matrix of H, if the knowledge of H is available at the transmitter. By doing so, the effective channel for the multiple data streams at the receiver side can be diagonalized, eliminating the interference between the multiple data streams. However, the overhead required to feedback the exact value of H is often prohibitive. In order to reduce feedback overhead, a set of precoding matrices are defined to quantize the space of the possible values that H could substantiate. With the quantization, a receiver feeds back the preferred precoding scheme, normally in the form of the index of the preferred precoding matrix, the rank, and the indices of the preferred precoding vectors. The receiver may also feed back the associated CQI values for the preferred precoding scheme.

Another perspective of a MIMO system is whether the multiple data streams for transmission are encoded separately or encoded together. If all the layers for transmission are encoded together, we call it a single codeword (SCW) MIMO system.

Figure 8:
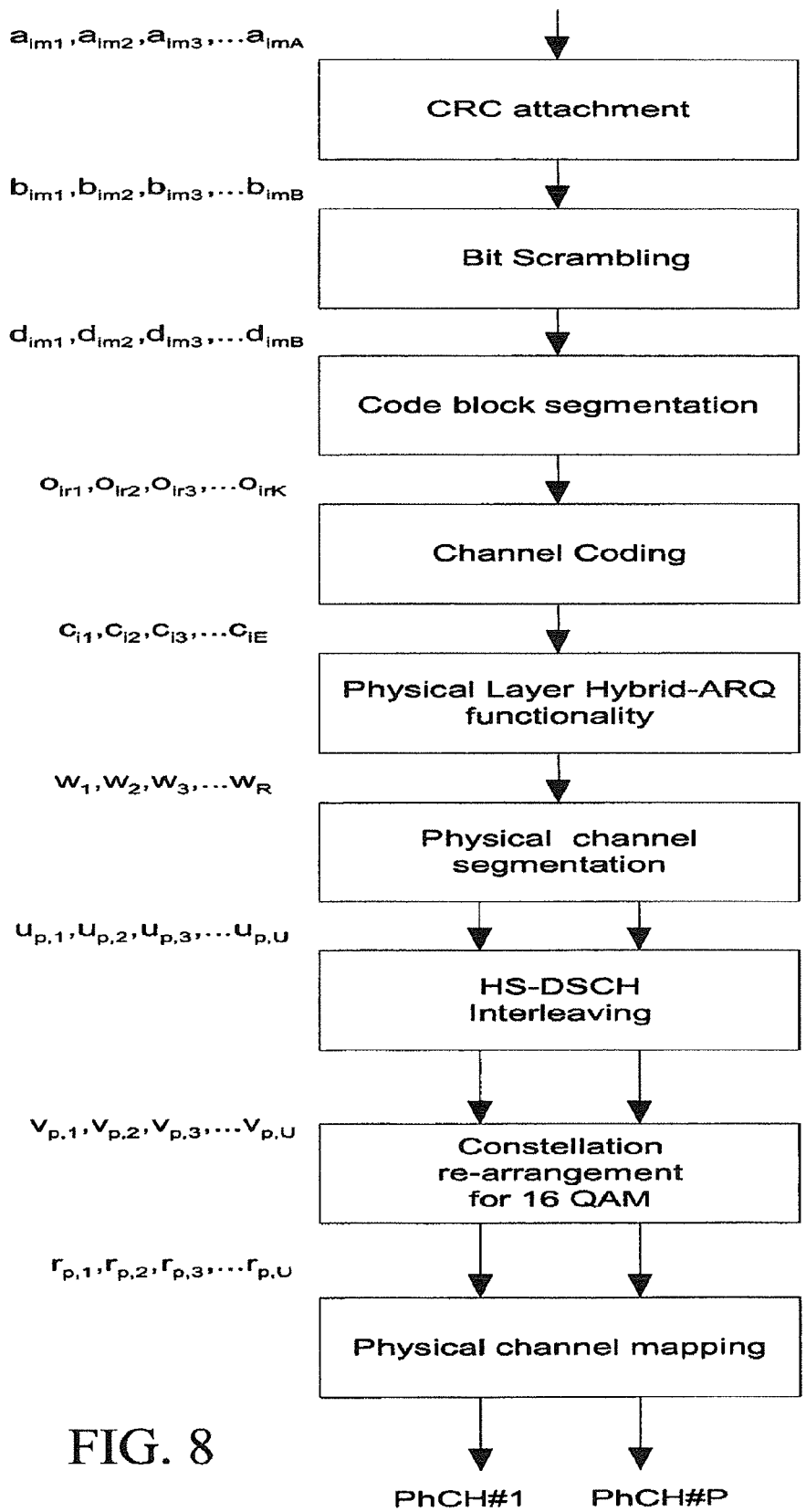
FIG. 8 schematically shows a coding chain for High Speed Data Shared Channel (HS-DSCH) in a High Speed Downlink Packet Access (HSDPA) system.
Figure 9:
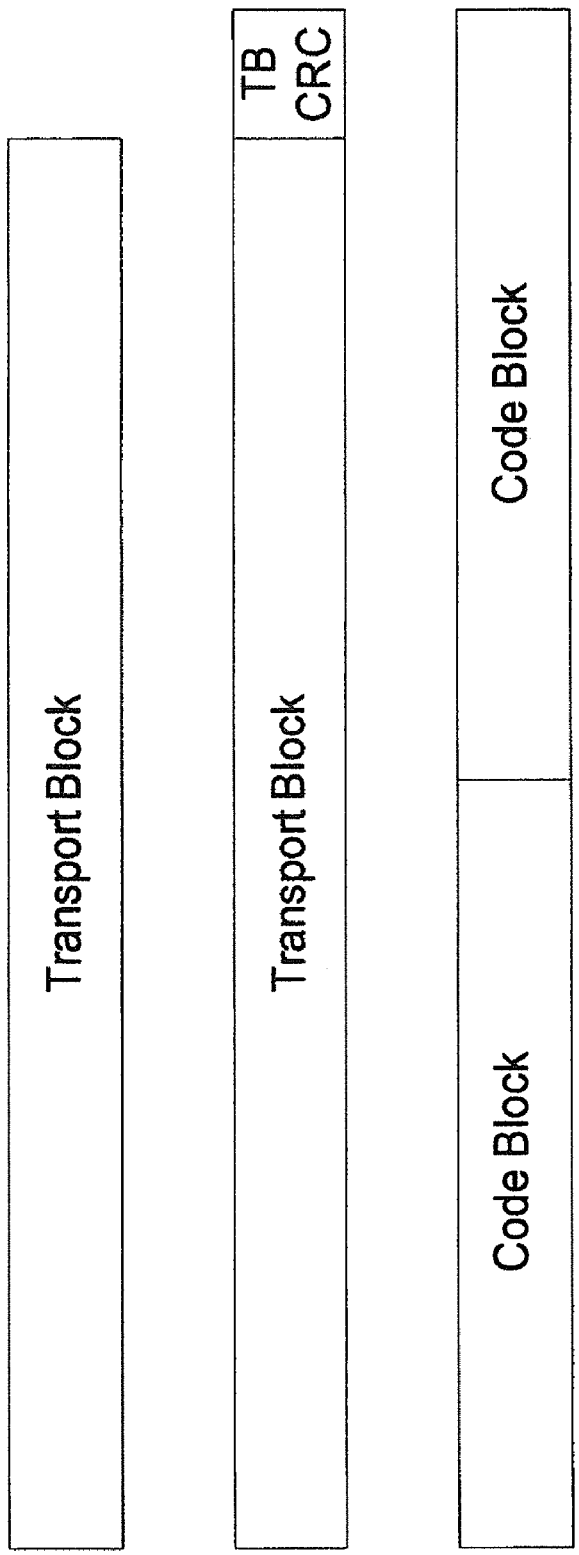
FIG. 9 schematically shows a transport block cyclic redundancy check (CRC) and code block segmentation.

In a LTE system, when a transport block is large, the transport block is segmented into multiple code blocks so that multiple coded packets can be generated, which is advantageous because of benefits such as enabling parallel processing or pipelining implementation and flexible trade off between power consumption and hardware complexity. As an example, the encoding process of the High Speed Data Shared Channel (HS-DSCH) in a High Speed Downlink Packet Access (HSDPA) system is illustrated in the FIG. 8. In the current HS-DSCH design, only one 24-bit cyclic redundancy check (CRC) is generated for the whole transport block for the purpose of error detection for that block. If multiple code blocks are generated and transmitted in one transmission time interval (TTI), the receiver may correctly decode some of the code blocks but not the others. In that case, the receiver will feedback a non-acknowledgement (NAK) to the transmitter because the CRC for the transport block will not check. The relationship of transport block, transport block CRC (TB CRC), and code block segmentation is shown in FIG. 9.

Assume we use an L-bit CRC polynomial to generate the code block CRC. Denote the CRC generation polynomial by:

$$g(x) = g_0 x^L + g_1 x^{L-1} + \ldots + g_{L-1} x + g_L \quad (1)$$

In general, for a message:

$$m(x) = m_0 x^{M-1} + m_1 x^{M-2} + \ldots + m_{m-2} x + m_{M-1} \quad (2)$$

the CRC encoding is performed in a systematic form. Denote the CRC parity bits of the message as $p_0, p_1, \ldots, p_{L-1}$, which can also be represented as a polynomial of:

$$p(x) = p_0 x^{L-1} + p_1 x^{L-2} + \ldots + p_{L-2} x + p_{L-1} \quad (3)$$

The polynomial, $$m(x) \cdot x^L - p(x) = m_0 x^{M+L-1} + m_1 x^{M+L-2} + \ldots + m_{M-2} x^{L+1} + m_{M-1} x^L + p_0 x^{L-1} + p_1 x^{L-2} + \ldots + p_{L-2} x + p_{L-1} \quad (4)$$

yields a remainder equal to 0 when divided by g(x).

Note that if each bit in the message is binary, the message can be represented as a polynomial defined on binary Galois field (GF(2)). In that case, the operation of '+' and '−' is the same. In other words, if the message bits are binary, the message with CRC attached can be represented by either $m(x) \cdot x^L + p(x)$ or $m(x) \cdot x^L - p(x)$. In the rest of this invention, we assume the message bits are binary for the sake of convenience. The ideas disclosed in this invention may, however, certainly apply when the message bits are non-binary.

Figure 10:
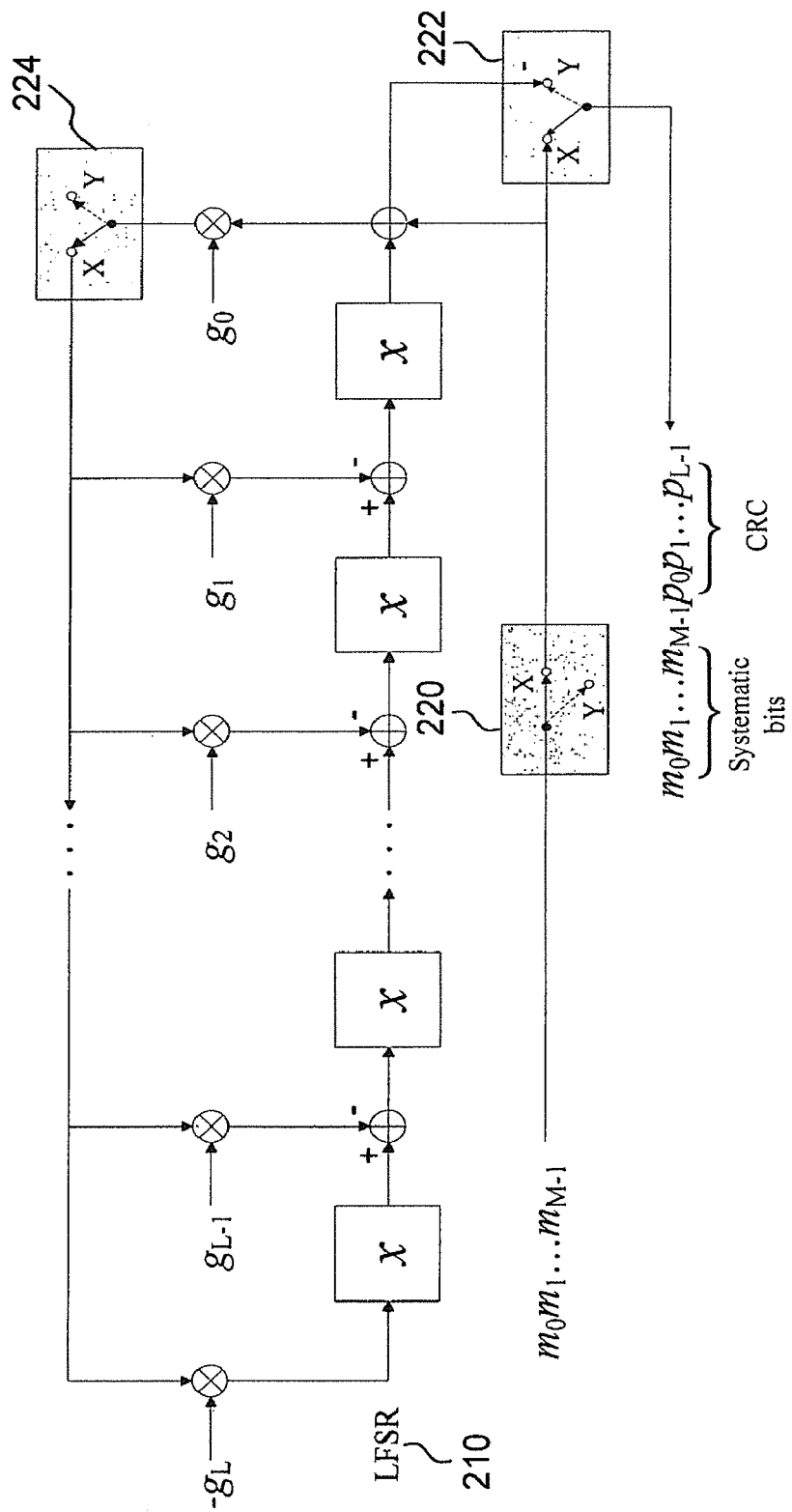
FIG. 10 is an illustration of using a linear feedback shift register (LFSR) for CRC computation.

One reason of the popularity of CRC is because of its simplicity in implementation. CRC calculation can be easily implemented by a linear feedback shift register (LFSR). LFSR can be used as a circuit for polynomial division. As shown in FIG. 10, assume an L-bit CRC is used, LFSR 210 has L shift registers. Switches 220, 222 and 224 are initially placed at position X. The message bit $m_0, m_1, \ldots,$ and $m_{M-1}$ are fed into LFSR 210 one at a time in an order of increasing index. After the last bit ($m_{M-1}$) has been fed into LFSR 210, switches 220, 222 and 224 are moved to position Y. LFSR 210 is shifted by another L times to produce the CRC at the output of the rightmost register. Note the LFSR in FIG. 9 is only an example. There are certainly other implementations of LFSR for polynomial division and CRC calculation.

Figure 11:
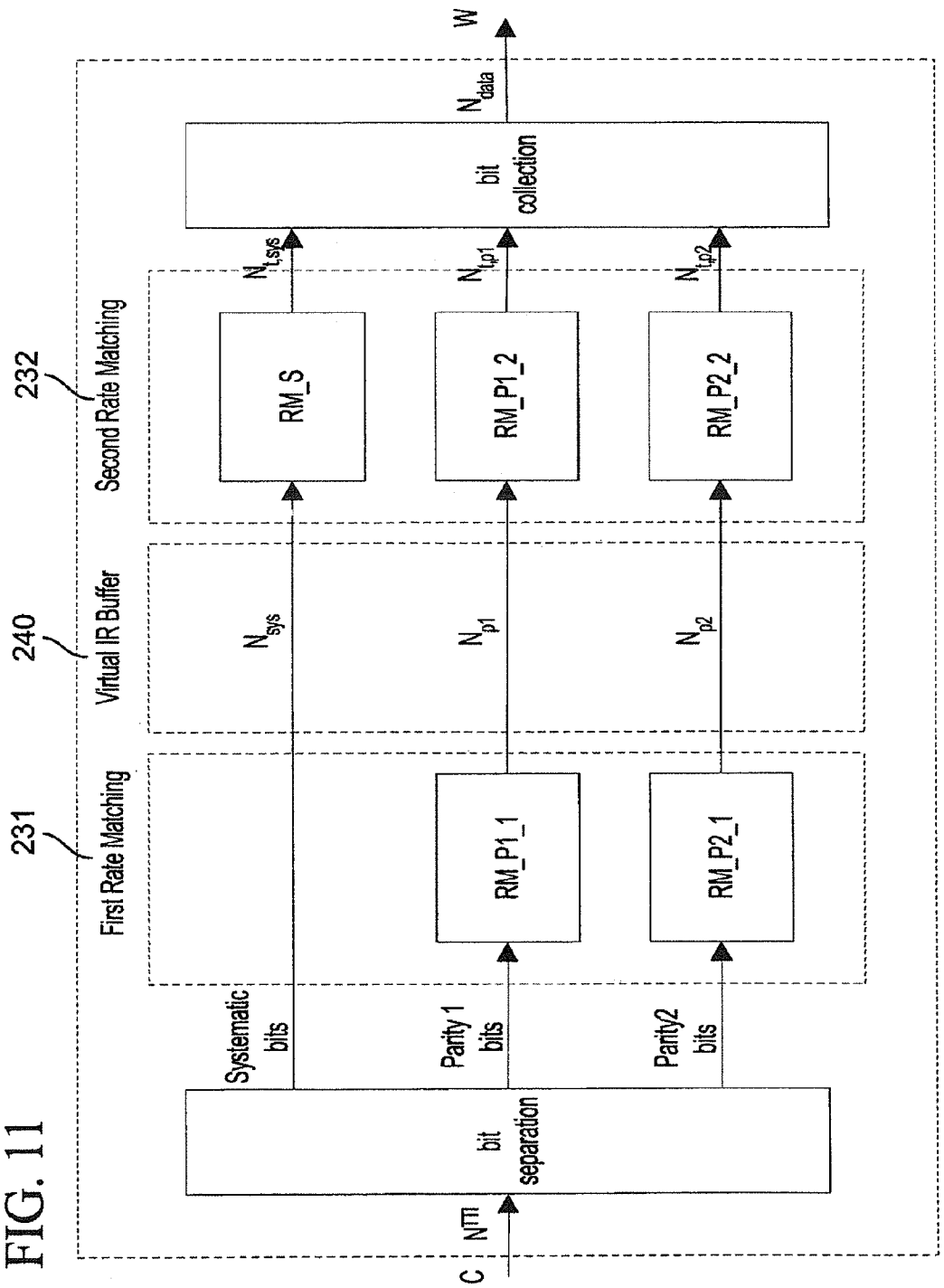
FIG. 11 schematically shows High Speed Data Shared Channel (HS-DSCH) hybrid ARQ functionality.

The hybrid ARQ functionality matches the number of bits at the output of the channel coder to the total number of bits of the High Speed Physical Downlink Shared Channel (HS-PDSCH) set to which the High Speed Data Shared Channel (HS-DSCH) is mapped. The hybrid ARQ functionality is controlled by the redundancy version (RV) parameters. The exact set of bits at the output of the hybrid ARQ functionality depends on the number of input bits, the number of output bits, and the RV parameters. The hybrid ARQ functionality consists of two rate-matching stages 231 and 232, and a virtual buffer 240 as shown in FIG. 11. First rate matching stage 231 matches the number of input bits to virtual IR buffer 240, information about which is provided by higher layers. Note that, if the number of input bits does not exceed the virtual IR buffering capability, first rate-matching stage 231 is transparent. Second rate matching stage 232 matches the number of bits at the output of first rate matching stage 231 to the number of physical channel bits available in the HS-PDSCH set in the TTI.

Figure 12:
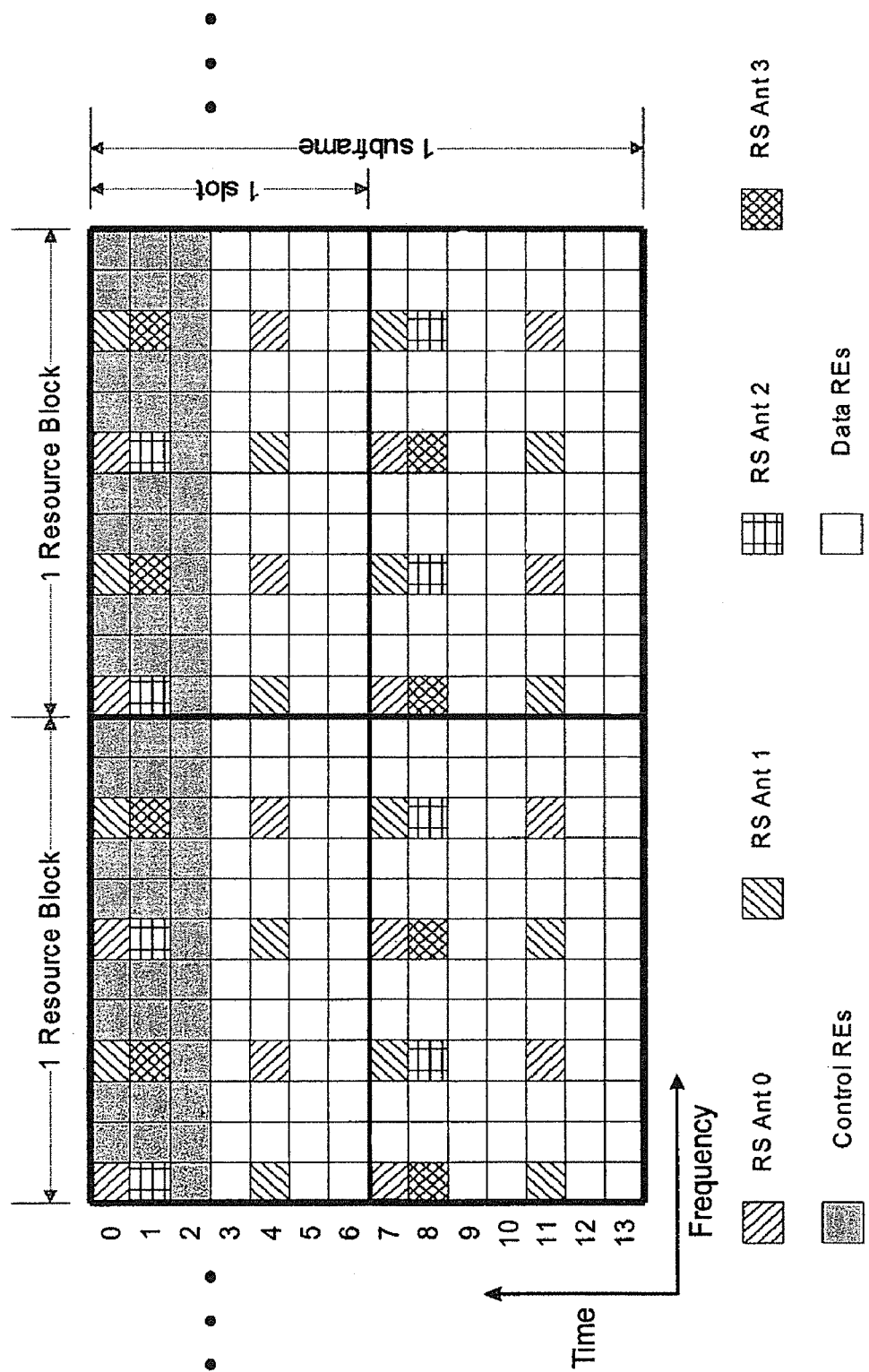
FIG. 12 schematically shows long term evolution (LTE) downlink subframe structure.

The downlink subframe structure of LTE is shown in FIG. 12. In a typical configuration, each subframe is 1 ms long, containing 14 OFDM symbols. Assume the OFDM symbols in a subframe are indexed from 0 to 13. Reference symbols (RS) for antenna 0 and 1 are located in OFDM symbols 0, 4, 7, and 11. If present, reference symbols (RS) for antennas 2 and 3 are located in OFDM symbols 2 and 8. The control channels, including Control Channel Format Indicator (CCFI), acknowledgement channel (ACK), packet data control channel (PDCCH), are transmitted in the first one, or two, or three OFDM symbols. The number of OFDM symbols used for control channel is indicated by CCFI. For example, the control channels can occupy the first OFDM symbol, or the first two OFDM symbols, or the first three OFDM symbols. Data channels, i.e., Physical Downlink Shared Channel (PDSCH), are transmitted in other OFDM symbols.

Figure 13:
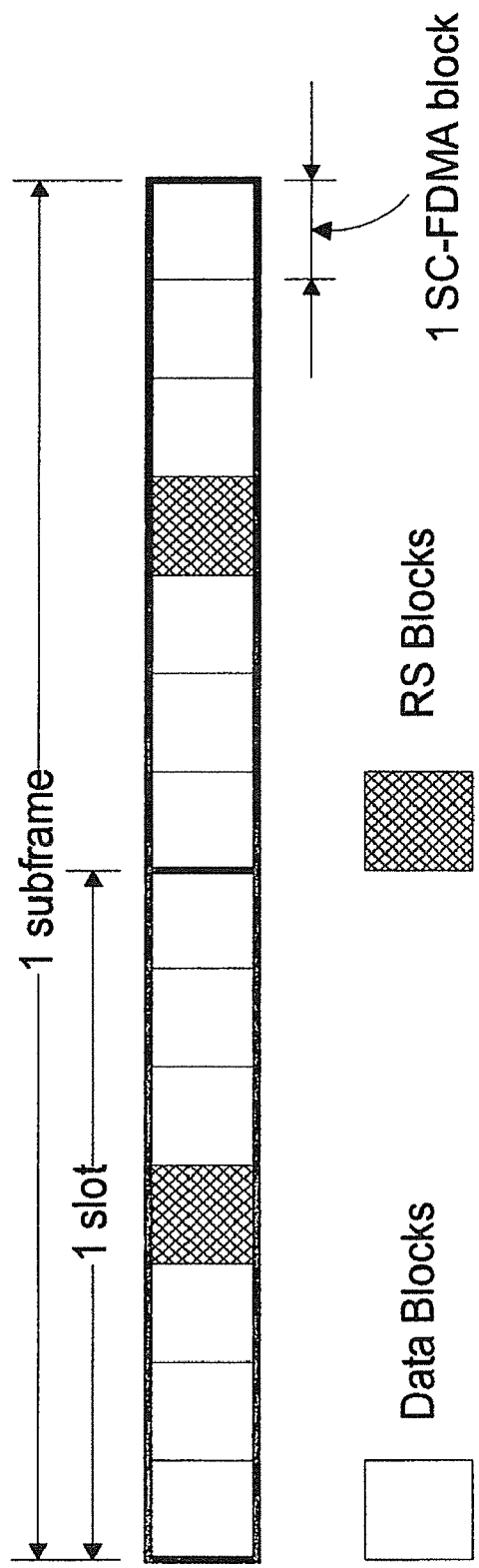
FIG. 13 schematically shows LTE uplink subframe structure.

The uplink subframe structure (for data transmissions) is shown in FIG. 13. Note the LTE uplink is a SC-FDMA based system, which is very much like an OFDMA system with some differences. Similar to an OFDM symbol, each SC-FDMA block has a cyclic prefix (CP). For data transmissions, the reference signals (RSs) are located at the 4-th SC-FDMA block and the 11-th SC-FDMA block, while the rest of the SC-FDMA blocks carrying data. Note that FIG. 13 only shows the time-domain structure of an uplink subframe. For each individual UE, its transmission may only occupy a portion of the whole bandwidth in frequency domain. And different users and control signals are multiplexed in the frequency domain via SC-FDMA.

In this invention, we propose methods and apparatus to compute multiple CRCs for a transmission to improve the reliability of the transmission and reduce the transmitter and receiver complexity.

Aspects, features, and advantages of the invention are readily apparent from the following detailed description, simply by illustrating a number of particular embodiments and implementations, including the best mode contemplated for carrying out the invention. The invention is also capable of other and different embodiments, and its several details can be modified in various obvious respects, all without departing from the spirit and scope of the invention. Accordingly, the drawings and description are to be regarded as illustrative in nature, and not as restrictive. The invention is illustrated by way of example, and not by way of limitation, in the figures of the accompanying drawings. In the following illustrations, we use data channel in LTE systems as an example. The technique illustrated here, however, can certainly be used in other channel in LTE systems, and other data, control, or other channels in other systems whenever applicable.

Figure 14:
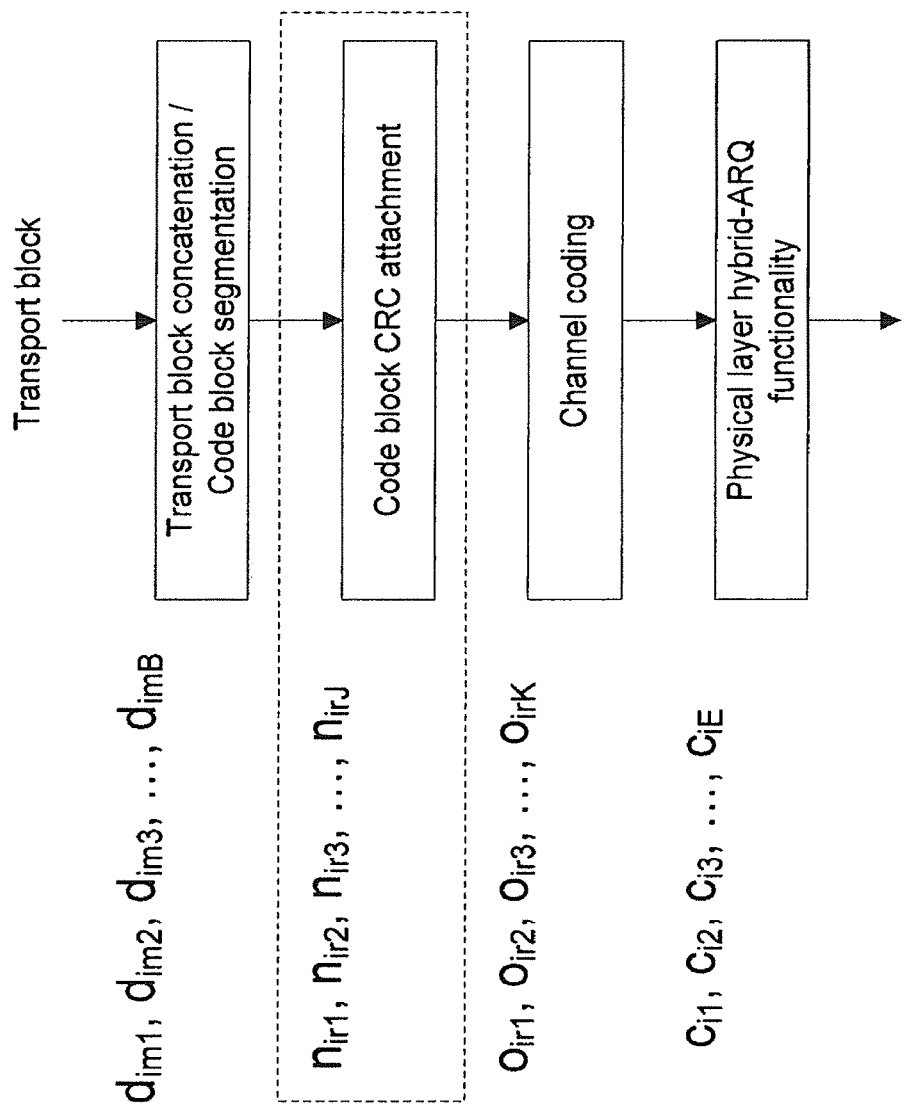
FIG. 14 schematically shows code block CRC.

We first illustrate the concept of transport block, code block, and code block Cyclic Redundancy Check (CRC). A portion of the encoding processing chain at the transmitter side is shown in FIG. 14. Multiple transport blocks in a TTI can be serially concatenated, if necessary. If the number of bits after transport concatenation is larger than Z, which is the maximum size of a code block in question, then code block segmentation is performed after the concatenation of the transport blocks. Note that in this invention, the transport blocks may or may not contain transport block CRC before the segmentation. After the code block segmentation, CRC can be generated for some, or all, of the code blocks. For illustration purpose, let's assume the code block CRC is generated for every code block, although the ideas disclosed in this invention certainly apply otherwise. For ease of illustration, we assume there is only one transport block. All the embodiments in this invention apply, however, to cases with multiple transport blocks and transport block concatenation. Also note that although we often use transmitter processing to illustrate the ideas of the invention, all the embodiments in this invention apply to CRC computation at both the transmitter and the receiver.

Denote the input bits to CRC computation by $a_0, a_1, \ldots, a_{A-1}$ where A is the size of the transport block. We call the input bits the information bits. Again, the methods described in this invention apply regardless of whether there is one or multiple transport block or whether the transport blocks contain transport block CRC or not. Assume we use an L-bit CRC polynomial to generate the code block CRC. Denote the CRC generation polynomial by:

$$g(x) = g_0 x^L + g_1 x^{L-1} + \ldots + g_{L-1} x + g_L \quad (5)$$

The transport block can be represented by a polynomial:

$$a(x) = a_0 x^{A-1} + a_1 x^{A-2} + \ldots + a_{A-2} x + a_{A-1} \quad (6)$$

Assume with code block segmentation, the transport block message is segmented into C code blocks. Denote the bits in code block i by $b_{i,0}, b_{i,1}, \ldots, b_{i,(B_i-1)}$, where $B_i$ is the size of the code block i, i=0, 1, . . . , C−1. Note the polynomial representation of code block i is:

$$b_i(x) = b_{i,0} x^{B_i-1} + b_{i,1} x^{B_i-2} + \ldots + b_{i,(B_i-2)} x + b_{i,(B_i-1)} \quad (7)$$

Obviously, $$A = \sum_{i=0}^{C-1} B_i.$$

Figure 15:
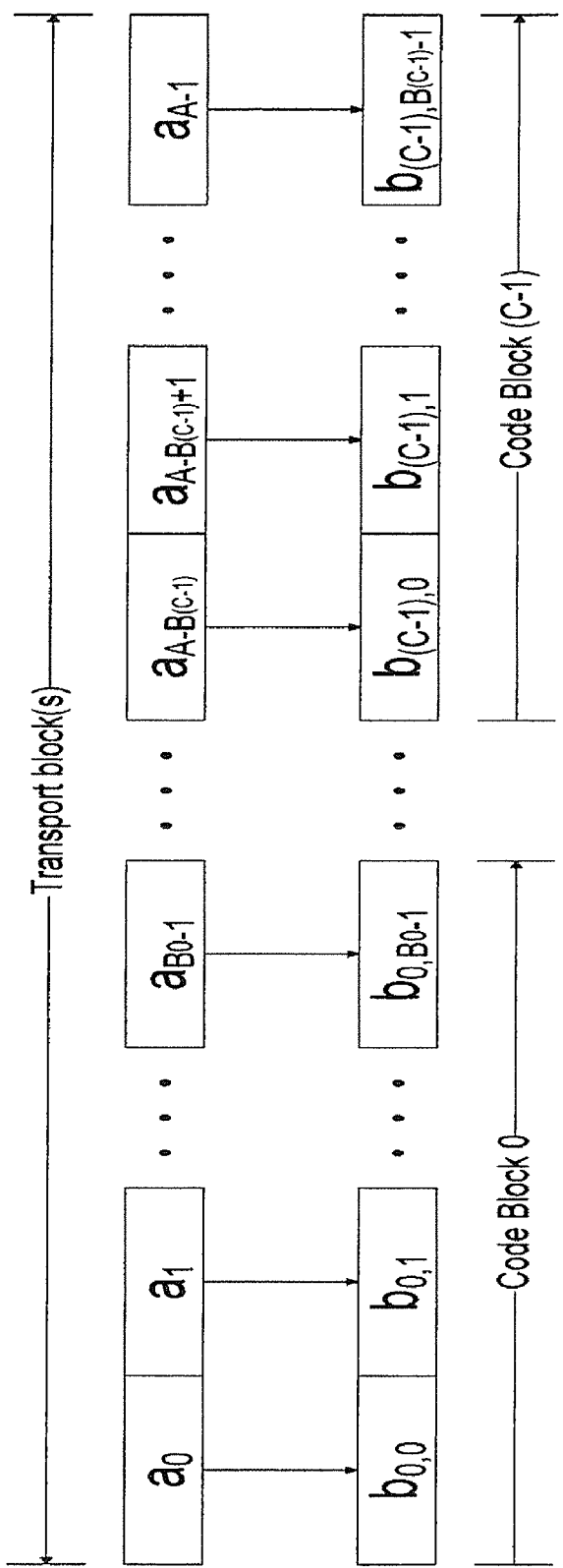
FIG. 15 illustrates an example of code block segmentation.

Without loss of generality, we further assume a natural order of mapping from the information bits in the transport block to the code blocks, as shown in FIG. 15. We define:

$$D_i = \sum_{j=0}^{i-1} B_j, \text{ for } i = 0, 1, \ldots, C. \quad (8)$$

(8)
In other words, $$D_0 = 0, D_1 = B_0, D_2 = B_0 + B_1, \ldots, D_c = \sum_{i=0}^{C-1} B_i = A.$$

The transport block is segmented into C code blocks. The information bits in the i-th code block are as follows:

$$b_{i,0} = a_{D_i}, b_{i,1} = a_{D_i+1} \ldots b_{i,B_i} = a_{D_{i+1}-1}, \text{ for } i=0, 1, \ldots, C-1. \quad (9)$$

In this way, the relationship between the transport block and the code blocks can be established as follows, $$a(x) = \sum_{i=0}^{C-1} [b_i(x) \cdot x^{A-D_{i+1}}] \quad (10)$$

(10)
We further define:

$$a_k(x) = \sum_{i=0}^{K} [b_i(x) \cdot x^{D_{k+1}-D_{i+1}}], \text{ for } k = 0, 1, \ldots, C-1. \quad (11)$$

where $a_k(x)$ is the polynomial presentation of the information bits up to the k-th code block, including information bits in the previous code blocks. It is easy to see that $a_0(x)=b_0(x)$, and $a_{C-1}(x)=a(x)$. For the sake of simplicity, in the rest of the invention, these notations are used without repeated definition.

In a first embodiment according to the principles of the present invention, in a transmission of a first plurality of bits with a second plurality of CRCs or in a receiving process of such a transmission, at least one CRC is computed based on a subset of bits of the first plurality of bits such that at least one bit of the first plurality of bits is not in the said subset. In an example shown in FIG. 16, CB0_CRC is computed based on information bits in Code Block 0 but not based on information bits in Code Block 1 or Code Block 2. In doing so, a UE can use the CB0_CRC to check whether the information bits in Code Block 0 are received correctly before finishing the receiver processing for Code Block 1 and Code Block 2. This feature is particularly beneficial in terms of UE complexity reduction and power saving. The code block CRC can be used for purposes such as, but not limited to, providing error detection for the corresponding code block or code blocks, early stopping of iterative turbo decoding that can achieve power saving and statistical multiplexing of decoding capacity among code blocks, detecting decoding error of one code block that can avoid unnecessary decoding of other code blocks in the event of decoding error of one code block, etc.

Figure 16:
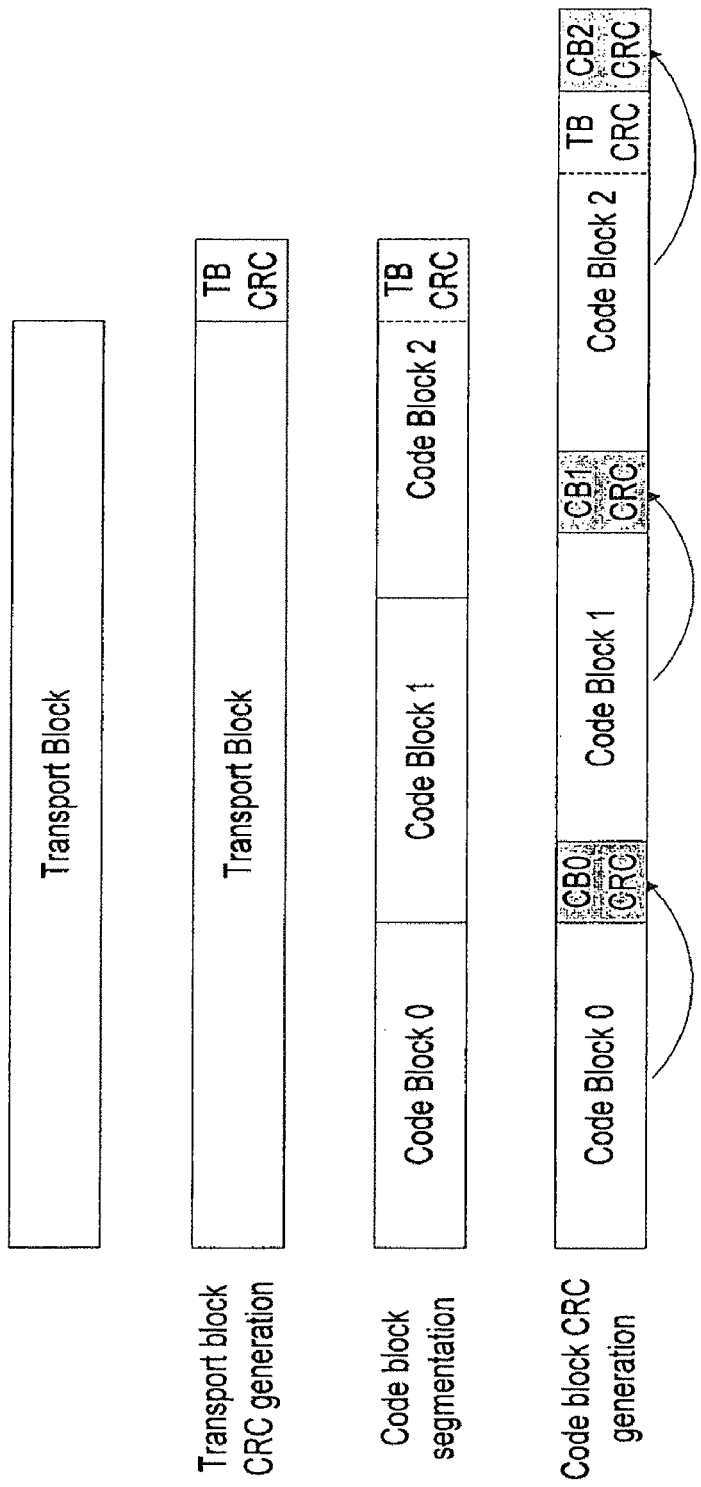
FIG. 16 schematically illustrates code block (CB) CRCs and transport block (TB) CRCs according to one embodiment of the principles of the present invention.

In a second embodiment according to the principles of the present invention, in a transmission of a first plurality of bits with a second plurality of CRCs or in the receiver processing of such a transmission, at least one CRC is computed based on a subset of the first plurality of bits that are jointly encoded by some type of forward error correcting code. For example, as shown in FIG. 16, CB0_CRC is computed based on the bits in Code Block 0, a subset of all the bits in the transport block. The bits in Code Block 0 are jointly encoded by some forward-error-correcting (FEC) code such as turbo code. FEC coding sometimes is also called channel coding. Note that CB0_CRC is normally also jointly encoded with information bits in Code Block 0 to achieve error protection for both the information bits and the CRC bits. By synchronizing the block of information bits for CRC computation and the block of information bits for FEC channel coding, a UE can use the code block CRC during the decoding process and determining whether the corresponding code block is decoded correctly. And this process can be done separately for each code block with a code block CRC, either in a parallel or a pipeline and serial fashion.

Figure 17:
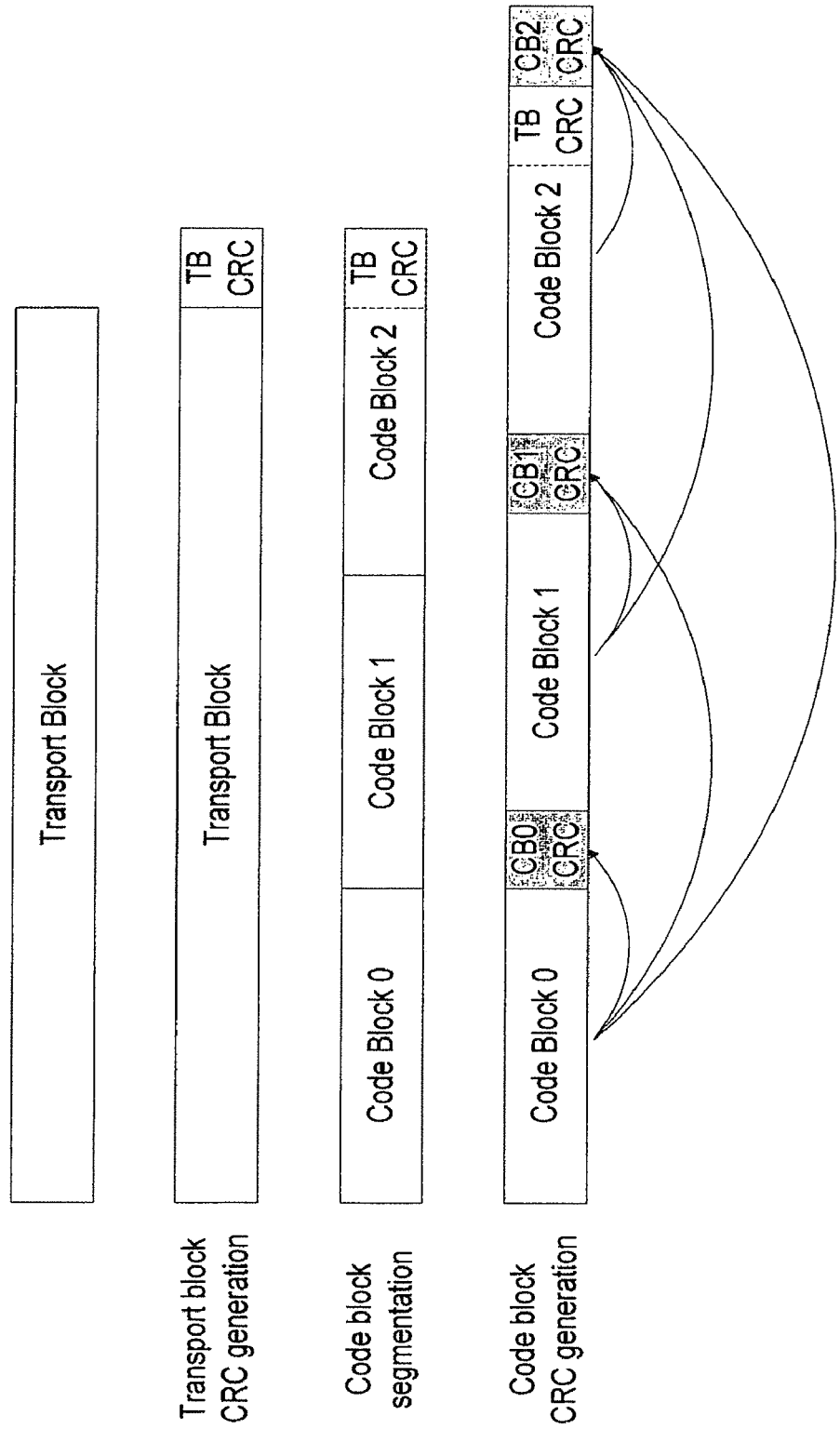
FIG. 17 schematically illustrates code block (CB) CRCs and transport block (TB) CRCs according to another embodiment of the principles of the present invention.

In a third embodiment according to the principles of the present invention, in a transmission of a first plurality of bits with a second plurality of CRCs or in the receiver processing of such a transmission, a first CRC is computed based on a first subset of bits while a second CRC is computed based on a second subset of bits. One example is shown in FIG. 16. In this example, the "subset of bits" is referred to as a code block. A transport block CRC is computed for the transport block. Then the transport block is segmented into three code blocks. A CRC is computed for each code block. CB0_CRC, which is the code block CRC attached to Code Block 0, is derived based on the bits in Code Block 0; CB1_CRC, which is the code block CRC attached to Code Block 1, is derived based on the bits in Code Block 1; CB2_CRC, which is the code block CRC attached to Code Block 2, is derived based on the bits in Code Block 2. Note this embodiment certainly applies when there is no transport block CRC. Also note that, in this example, the first subset of bits from which a first CRC is derived does not overlap with the second subset of bits from which a second CRC is derived. The subsets of bits can, however, certainly overlap without departing from the disclosure of this invention. Also note that some subsets may include all the bits in the transmission. Also note that it is not necessary to compute CRCs for all the code blocks to use this invention. Some code block may not have code block CRC. Also note that a subset can also include bits in multiple code blocks. For example, as shown in FIG. 17, CB0_CRC is derived based on the subset of bits that include the bits in Code Block 0; CB1_CRC is derived based on the subset of bits that include both the bits in Code Block 0 and the bits in Code Block 1; CB2_CRC is derived based on the subset of bits that include the bits in Code Block 0, the bits in Code Block 1, and the bits in Code Block 2.

In a fourth embodiment according to the principles of the present invention, in a transmission of a first plurality of bits with a second plurality of CRCs or in the receiver processing of such a transmission, the bits upon which a first CRC is derived are a subset of bits upon which a second CRC is derived. One example is shown in FIG. 17. For the purpose of illustration, we only show three code blocks. A transport block CRC is computed for the transport block. Then the transport block is segmented into three code blocks. A CRC is computed for each code block. CB0_CRC, which is the code block CRC attached to Code Block 0, is derived based on the bits in Code Block 0; CB1_CRC, which is the code block CRC attached to Code Block 1, is derived based on the bits in Code Block 0 and Code Block 1; CB2_CRC, which is the code block CRC attached to Code Block 2, is derived based on the bits in Code Block 0, Code Block 1, and Code Block 2. By doing so, we improve the miss detection performance of these CRCs, comparing with the CRCs derived based on a single code block. We assume the transport block is $a(x) = a_0 x^{A-1} + a_1 x^{A-2} + \ldots + a_{A-2} x + a_{A-1}$, where A is the transport block size. If transport block CRC (TB CRC) is used, the TB CRC is included in the message. As defined earlier, the transport block $a(x)$ is segmented into C code blocks with code block i represented by $b_i(x)$. We compute one CRC, namely CB0_CRC, and attach it to the first code block. The CB0_CRC can be derived from some or all of the bits in the first code block. We denote CB0_CRC by:

$$p_0(x) = p_{0,0} x^{L-1} + p_{0,1} x^{L-2} + \ldots + p_{0,L-2} x + p_{0,L-1}. \quad (12)$$

One example of computing CB0_CRC is by finding the remainder of $b_0(x) \cdot x^L$ divided by the CRC generator polynomial $g(x)$, in which $p_0(x)$ can be represented as:

$$p_0(x) = b_0(x) \cdot x^L - q_0(x) \cdot g(x) \quad (13)$$

where $q_0(x)$ is the quotient of $b_0(x) \cdot x^L$ divided by $g(x)$. We compute another CRC, namely CB1_CRC, and attach it to the second code block. CB1_CRC can be derived from some or all of the bits in the first code block and some or all of the bits in the second code block. We denote CB1_CRC by:

$$p_1(x) = p_{1,0} x^{L-1} + p_{1,1} x^{L-2} + \ldots + p_{1,L-2} x + p_{1,L-1}. \quad (14)$$

One example of computing CB1_CRC is by finding the remainder of $(b_0(x) \cdot x^{B_1} + b_1(x)) \cdot x^L$ divided by the CRC generator polynomial $g(x)$, in which $p_1(x)$ can be represented as:

$$p_1(x) = (b_0(x) \cdot x^{B_1} + b_1(x)) \cdot x^L - q_1(x) \cdot g(x), \quad (15)$$

where $q_1(x)$ is the quotient of $(b_0(x) \cdot x^{B_1} + b_1(x)) \cdot x^L$ divided by $g(x)$. By deriving CB1_CRC based on both the information bits in the first code block and the information bits in the second code block, we reduce the miss detection probability because CB1_CRC can be used to detect error of information bits in the first code block and the second code block.

Figure 18:
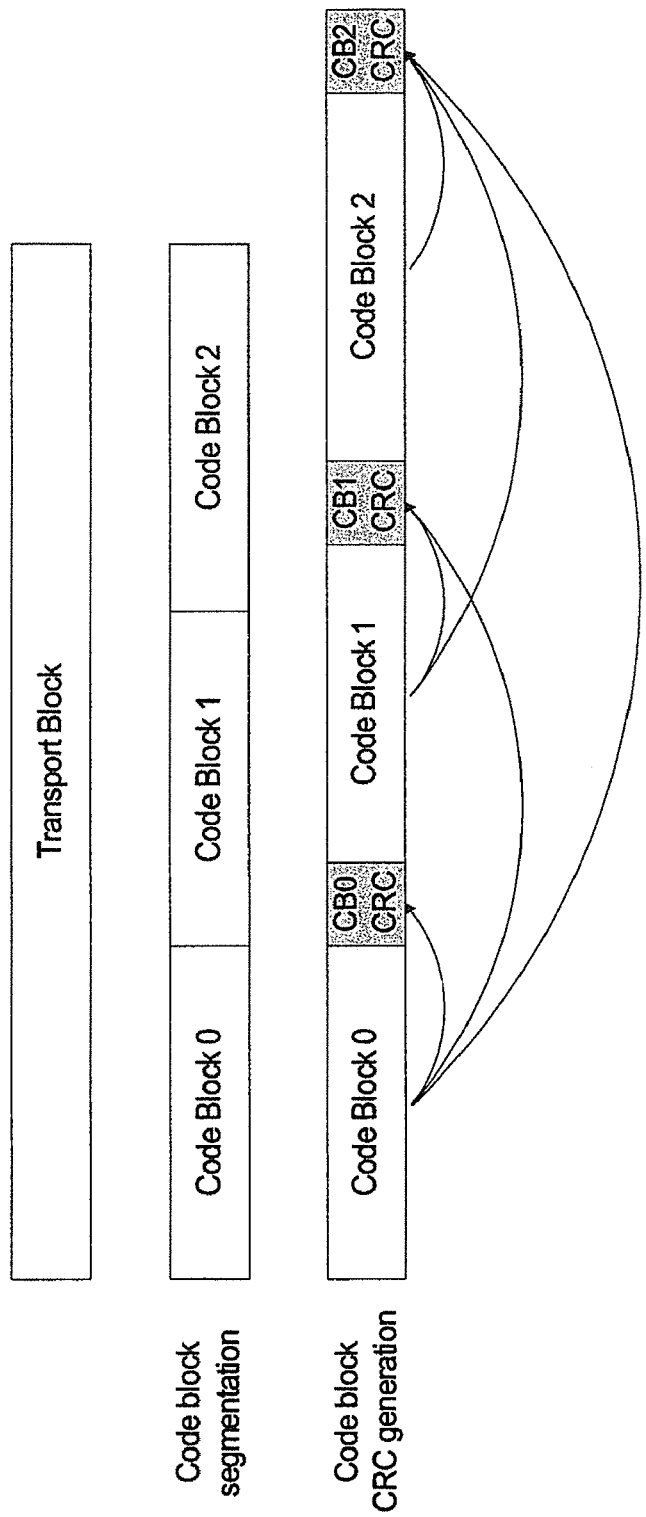
FIG. 18 schematically illustrates code block (CB) CRCs and transport block (TB) CRCs according to yet another embodiment of the principles of the present invention.

Obviously, if there are more than two code blocks, we can extend the operations in similar ways. For example, the CRC attached to Code Block 2 can be derived from bits in Code Block 0, Code Block 1, and Code Block 2. Alternatively, the CRC attached to one code block does not need to be derived based on the bits from all of the previous code blocks, including the current code block. For example, the CRC attached to Code Block 2 can be derived from the bits in Code Block 1 and Code Block 2, but not the bits in Code Block 0. Note this embodiment also applies when there is no transport block CRC, as shown in FIG. 18. If the error detection of the CB CRC is reliably enough, TB CRC may not be needed.

Figure 19:
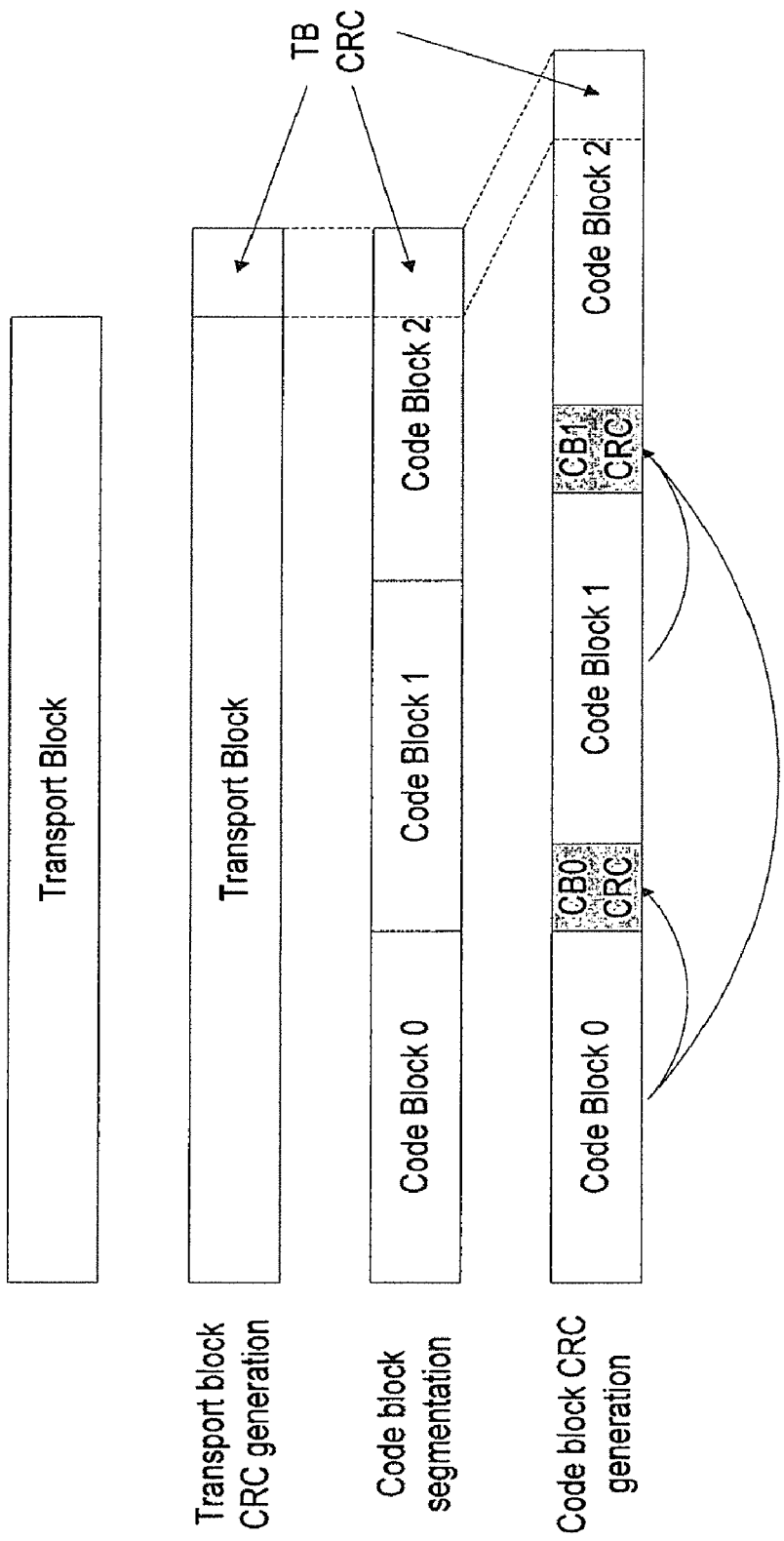
FIG. 19 schematically illustrates code block (CB) CRCs and transport block (TB) CRCs according to still another embodiment of the principles of the present invention.

In a fifth embodiment according to the principles of the present invention, in a transmission of a first plurality of bits with a second plurality of CRCs or in the receiver processing of such a transmission, a transport block CRC is derived from all the bits in a transport block before the code block segmentation while there is at least one subset of bits from which no code block CRC is computed. As shown in FIG. 19, a transport block CRC is computed based on bits in the transport block. Then the transport block, including the transport block CRC, is segmented into three code blocks. In this example, CB0_CRC is computed based upon bits in Code Block 0; CB1_CRC is computed based upon bits in Code Block 0 and Code Block 1. Because there is a transport block CRC that covers all the bits in the transport block, code block CRC for Code Block 2, however, is not necessary. The CB0_CRC can be used for stopping turbo decoding iterations for Code Block 0; the CB1_CRC can be used for stopping turbo decoding iteration for Code Block 1; and the TB_CRC can be used for stopping turbo decoding iteration for Code Block 2. At the same time, TB_CRC provide error detection for the whole transport block.

Figure 20:
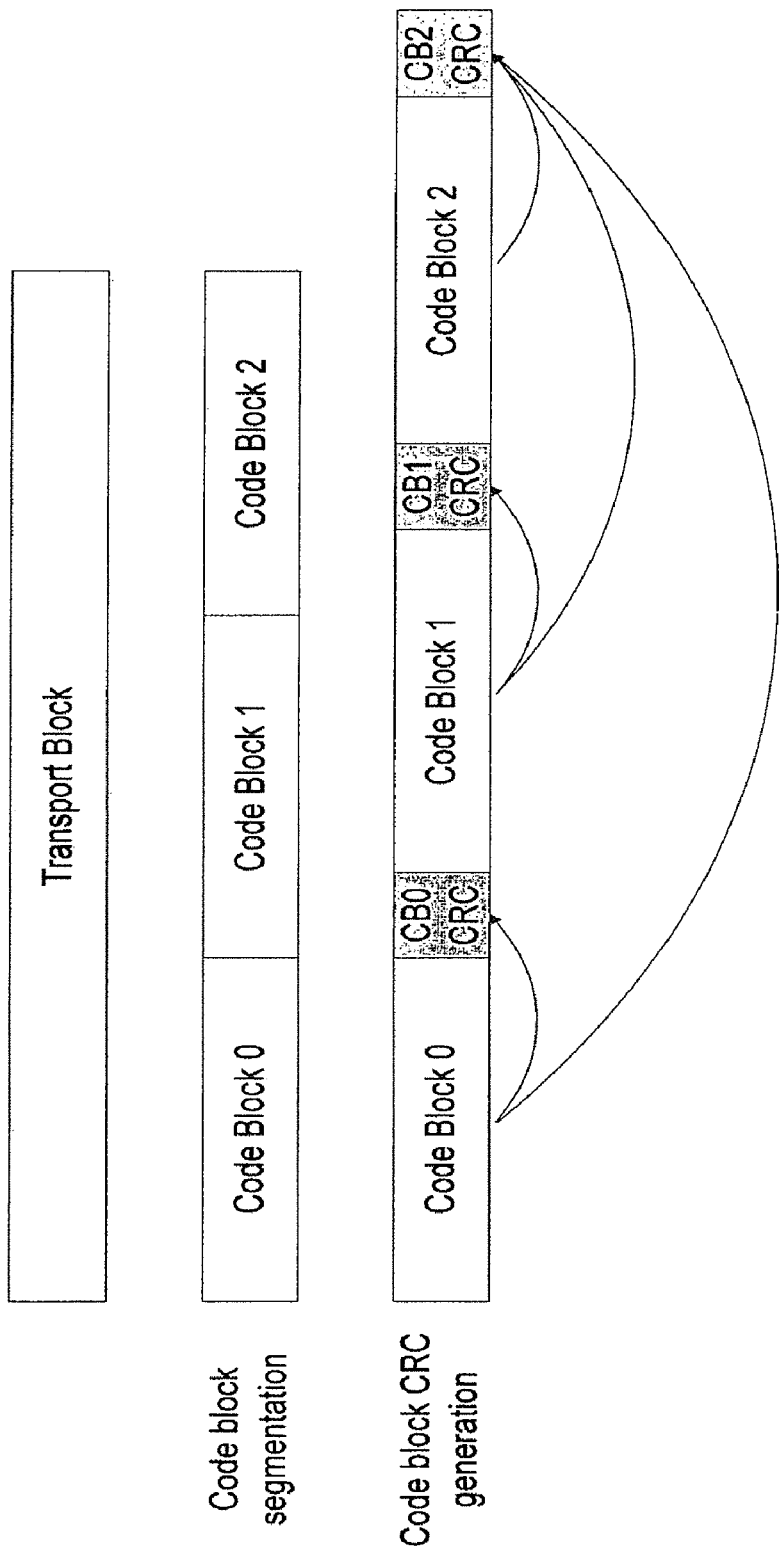
FIG. 20 schematically illustrates code block (CB) CRCs and transport block (TB) CRCs according to a further embodiment of the principles of the present invention.

In a sixth embodiment according to the principles of the present invention, in a transmission of a first plurality of information bits with a second plurality of CRCs or in the receiver processing of such a transmission, a first CRC is derived from all the information bits while a second CRC is derived from a subset of the information bits. As shown in FIG. 20, no transport block CRC is computed before code block segmentation. The transport block is segmented into three code blocks. Code block CRC is computed for each of the three code blocks. CB0_CRC is derived from the bits in Code Block 0; CB1_CRC is derived from the bits in Code Block 1; CB2_CRC is derived from the bits in Code Block 0, Code Block 1, and Code Block 2. The CB0_CRC can be used for stopping turbo decoding iterations or error detection for Code Block 0; the CB1_CRC can be used for stopping turbo decoding iteration or error detection for Code Block 1; and the CB2_CRC can be used for stopping turbo decoding iteration and error detection for Code Block 2. At the same time, CB2_CRC provide error detection for the whole transport block.

In the following embodiments, we illustrate how linear feedback shift register (LFSR) based circuits can be used to efficiently calculate multiple CRCs for a plurality of information bits. Note that although we use the transmitter side CRC generation for illustration purpose, it is straightforward for a person of ordinary skill in the art to apply these methods to the receiver processing. For the sake of convenience, we assume the CRC calculation circuit is initialized to all-zero state. The ideas disclosed in this invention may apply, however, when the initial state of the LFSR are set to non-zero state.

In a seventh embodiment according to the principles of the present invention, a first plurality of CRCs for a second plurality of information bits can be computed recursively with one single CRC calculation circuit. We compute one CRC, namely CB0_CRC, and attach it to the first code block. The CB0_CRC can be derived from some or all of the bits in the first code block. We denote CB0_CRC by $$p_0(x) = p_{0,0}x^{L-1} + p_{0,1}x^{L-2} + \ldots + p_{0,L-2}x + p_{0,L-1}. \quad (16)$$

One example of computing CB0_CRC is by finding the remainder of $b_0(x) \cdot x^L$ divided by the CRC generator polynomial $g(x)$, in which $p_0(x)$ can be represented as:

$$p_0(x) = b_0(x) \cdot x^L - q_0(x) \cdot g(x) \quad (17)$$

where $q_0(x)$ is the quotient of $b_0(x) \cdot x^L$ divided by $g(x)$. We compute another CRC, namely CB1_CRC, and attach it to the second code block. CB1_CRC can be derived from the bits in the first code block and the bits in the second code block. We denote CB1_CRC by $$p_1(x) = p_{1,0}x^{L-1} + p_{1,1}x^{L-2} + \ldots + p_{1,L-2}x + p_{1,L-1}. \quad (18)$$

In other words, CB1_CRC is the remainder of $(b_0(x) \cdot x^{B_1} + b_1(x)) \cdot x^L$ divided by the CRC generator polynomial $g(x)$, in which $p_1(x)$ can be represented as:

$$p_1(x) = (b_0(x) \cdot x^{B_1} + b_1(x)) \cdot x^L - q_1(x) \cdot g(x), \quad (19)$$

where $q_1(x)$ is the quotient of $(b_0(x) \cdot x^{B_1} + b_1(x)) \cdot x^L$ divided by $g(x)$. By deriving CB1_CRC based on both the information bits in the first code block and the information bits in the second code block, we reduce the miss detection probability because CB1_CRC can be used to detect error in both the first code block and the second code block. Similarly, the CRC for the k-th code block can be computed as the remainder of $a_k(x) \cdot x^L$ divided by $g(x)$. In other words, $$p_k(x) = a_k(x) \cdot x^L - q_k(x) \cdot g(x) \quad (20)$$

where $q_k(x)$ is the quotient of $a_k(x) \cdot x^L$ divided by $g(x)$. Note that:

$$a_k(x) = a_{k-1}(x) \cdot x^{B_k} + b_k(x). \quad (21)$$

This way of computing CRC lends itself well to a simple CRC calculation method. The CRC for the k-th code block can be represented as $$p_k(x) = [a_{k-1}(x) \cdot x^L \cdot x^{B_k} + b_k(x) \cdot x^L] - q_k(x) \cdot g(x) = p_{k-1}(x) \cdot x^{B_k} + b_k(x) \cdot x^L + [(q_{k-1}(x) \cdot x^{B_k} - q_k(x)) \cdot g(x)] \quad (22)$$

In other words, the CRC of $a_k(x)$ is the same as the CRC of $p_{k-1}(x) \cdot x^{B_k} + b_k(x) \cdot x^L$.

Figure 21:
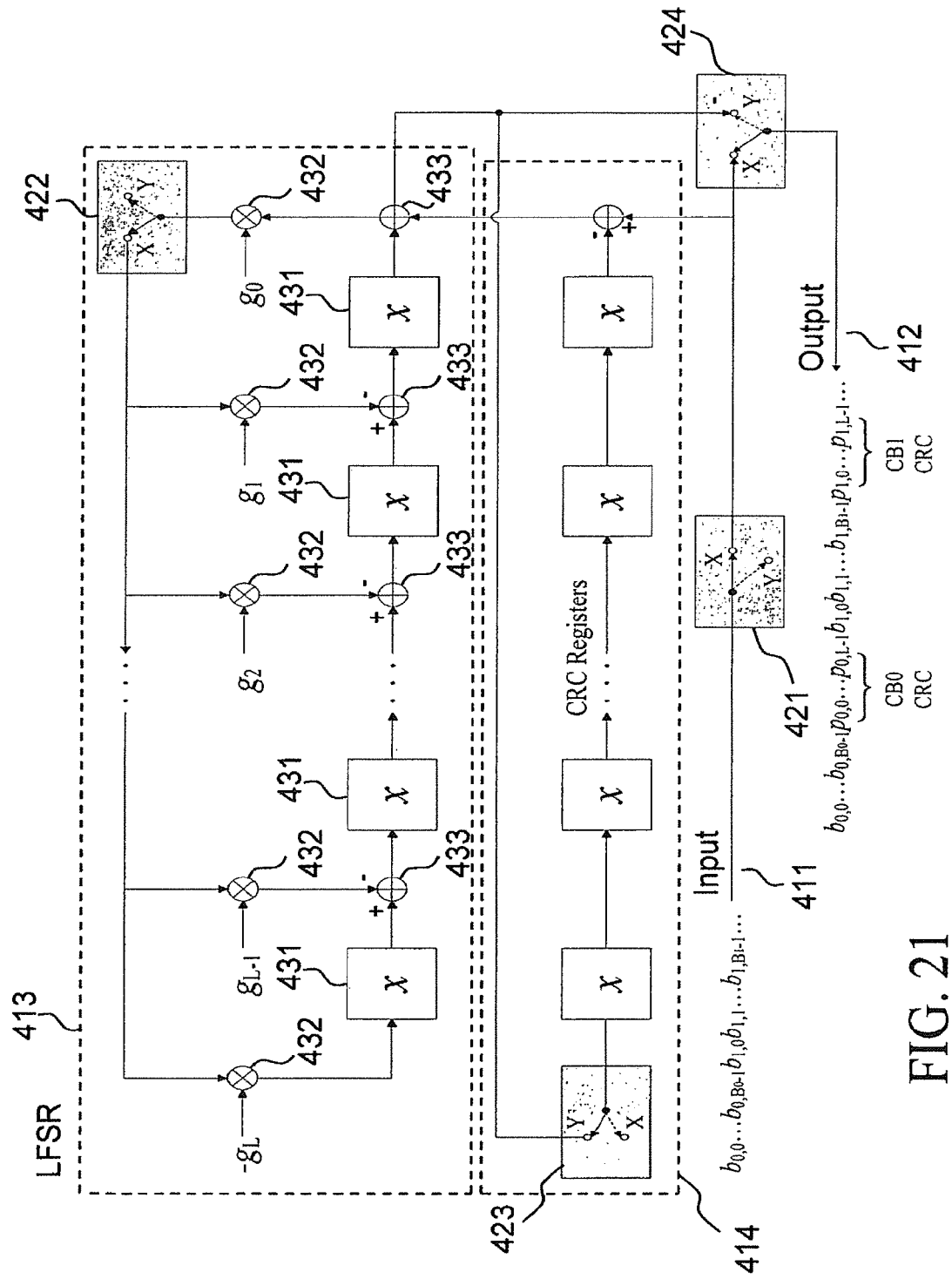
FIG. 21 schematically illustrates a CRC computation circuit for multiple code blocks constructed as an embodiment according to the principles of the present invention.

One example of circuit to recursively compute the CRC $p_i(x)$, $i = 0, 1, \ldots, C-1$ is shown in FIG. 21. As shown in FIG. 21, the circuit for computing the CRC is constructed with an input port 411 for receiving information data, an output port 412 for outputting the information data and CRC, a linear feedback shift register (LFSR) unit 413 communicatively connected between input port 411 and output port 412. LFSR unit 413 includes L shift registers 431, L AND gates 432 (represented by "x" surround by a circle) and L XOR gates 433 (represented by "+" surround by a circle). A cyclic redundancy check register unit 414 is connected between input port 411 and LFSR unit 413. Cyclic redundancy check register unit 414 includes L cyclic redundancy check registers. A first switch 421 is located between input port 411 and cyclic redundancy check register unit 414. First switch has a position X to connect input port 411 and cyclic redundancy check register unit 414, and a position Y to disconnect input port 411 and cyclic redundancy check register unit 414. A second switch 422 is located at a feedback loop of LFSR unit 413. Second switch 422 has a position X to connect the feedback loop of LFST unit 413, and a position Y to disconnect the feedback loop of LFST unit 413. A third switch 423 is located between LFST unit 413 and cyclic redundancy check register unit 414. Third switch 423 has a position X to disconnect LFST unit 413 and cyclic redundancy check register unit 414, and a position Y to connect LFST unit 413 and cyclic redundancy check register unit 414. A fourth switch 424 is located between input port 411, LFSR unit 413 and output port 412. Fourth switch 424 has a position X to connect input port 411 and output port 412, and a position Y to connect LFSR unit 413 and output port 412. The switches can be any contemporary electronic switches such as, for example, any contemporary field effect transistors (FETs). The corresponding procedure for operating the circuit shown in FIG. 21 is outlined as follows:

1. Initialize LFSR unit 413 to an all-zero state; Set k=0; Initialize the CRC registers to zero; Set all switches 421, 422, 423 and 424 at position X.
2. Input $b_k(x)$ into the circuit, one bit at a time. Note the LFSR is also shifted once for every bit input.
3. Change all 421, 422, 423 and 424 switches to position Y.
4. Shift LFSR unit 413 and the CRC registers L times to output $p_k(x)$, which is the L-bit CRC.
5. Reset LFSR unit 413 to all-zero state; Change all switches to position X.
6. Increase k.
7. If k<C, go to Step 2.

The CRC attached to the k-th code block can be represented by Equation 20: $p_k(x) = a_k(x) \cdot x^L - q_k(x) \cdot g(x)$. In other words, the CRC of the k-th code block is computed based on the information bits of the k-th code block and all previous code blocks. As we can see, the calculation of the code block CRCs is the same as the calculation of the transport block CRC, except that after input each code block to the circuit, the CRC should be stored and added back at some point into the CRC calculation for the next code block. In this way, separate circuits and extra computation complexity for calculating code block CRC and transport block CRC are avoided. In fact, the last code block CRC equals to a transport block CRC. This structure fits well with the pipelining structure of the multiple code blocks. In addition, the miss detection performance of the transport block is guaranteed at the minimum. Note that Equation (20) is only for the case when the k-th code block CEC is calculated based upon the information bits of the k-th codeblock and all previous code blocks.

Figure 22:
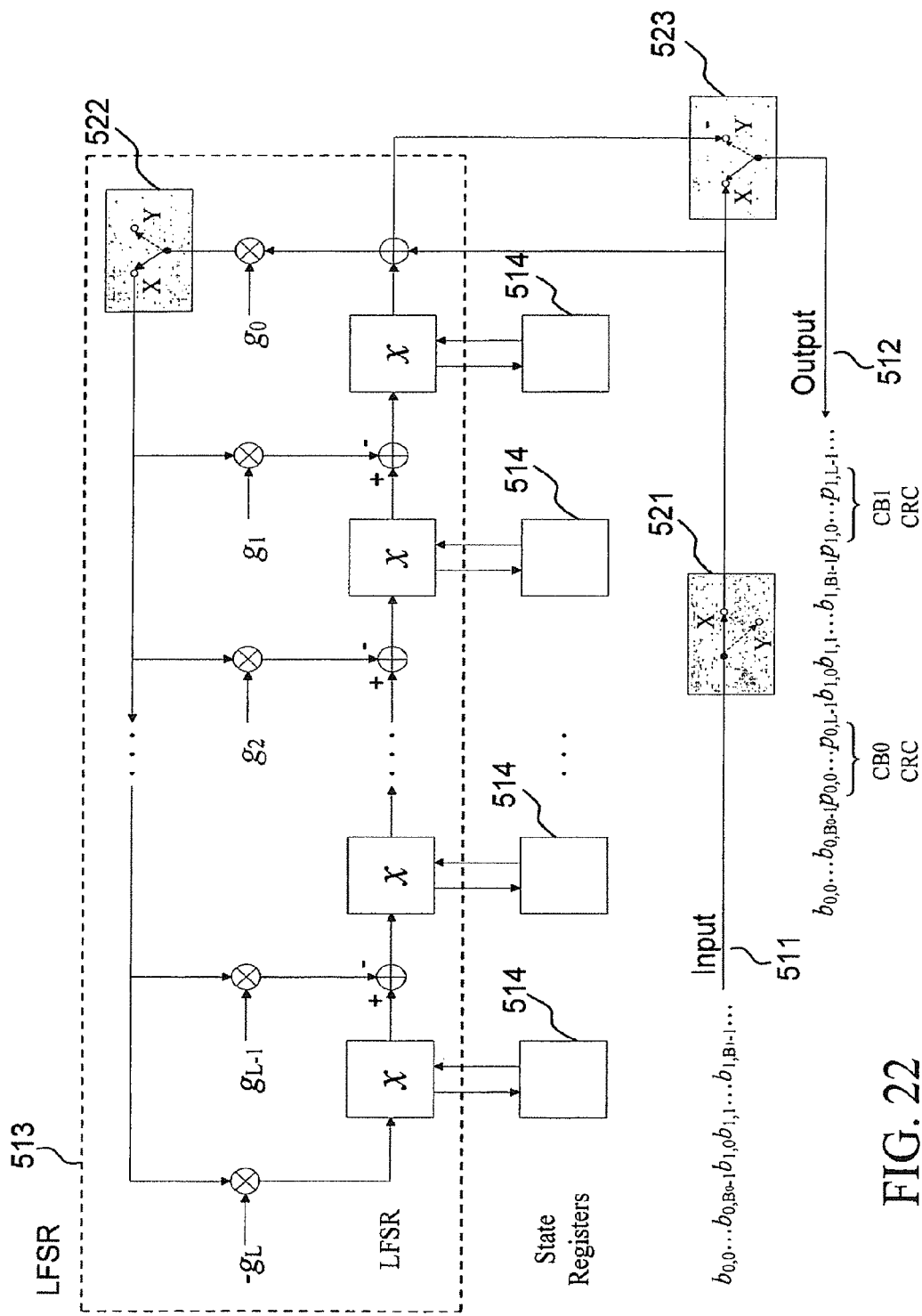
FIG. 22 schematically illustrates a CRC computation circuit for multiple code blocks constructed as another embodiment according to the principles of the present invention.

Alternatively, another example of circuit to recursively compute the CRC $p_i(x)$, i=0, 1, ..., C−1 is shown in FIG. 22 according to an eighth embodiment of the principles of the present invention. As shown in FIG. 22, the circuit is constructed with an input port 511 for receiving information data, an output port 512 for outputting the information data and CRC, a LFSR unit 513 connected between input port 511 and output port 512. LFSR unit 513 includes L shift registers. The circuit is further constructed with L state registers 514 connected to corresponding ones of the L shift registers to write and read data values to and from the L shift registers. A first switch 521 is located between input port 511 and LFSR unit 513. First switch 521 has a position X to connect input port 511 and LFSR unit 513, and a position Y to disconnect input port 511 and LFSR unit 513. A second switch 522 is located at a feedback loop of LFSR unit 513. Second switch 522 has a position X to connect the feedback loop of LFSR unit 513, and a position Y to disconnect the feedback loop of LFSR unit 513. A third switch 523 is located between input port 511, LFSR unit 513 and output port 512. Third switch 523 has a position X for connecting input port 511 with output port 512, and a position Y for connecting LFSR unit 513 and output port 512. This circuit achieves the same CRC computation as the circuit shown in FIG. 21. The corresponding procedure is outlined as follows:

1. Initialize LFSR unit 513 to all-zero state; Set k=0; Initialize state registers 514 to zero; Set all switches 521, 522 and 523 at position X.
2. Input $b_k(x)$ into the circuit via input port 511, one bit at a time. Note the LFSR is also shifted once for every bit input.
3. Write the value of shift registers in LFSR unit 513 to the corresponding state registers 514; Change all switches 521, 522 and 523 to position Y.
4. Shift LFSR unit 513 L times to obtain $p_k(x)$, which is the L-bit CRC.
5. Change all switches 521, 522 and 523 to position X; Write the value of state registers 514 into the corresponding shift registers in LFSR unit 513.
6. Increase K.
7. If k<C, go to Step 2.

Figure 23:
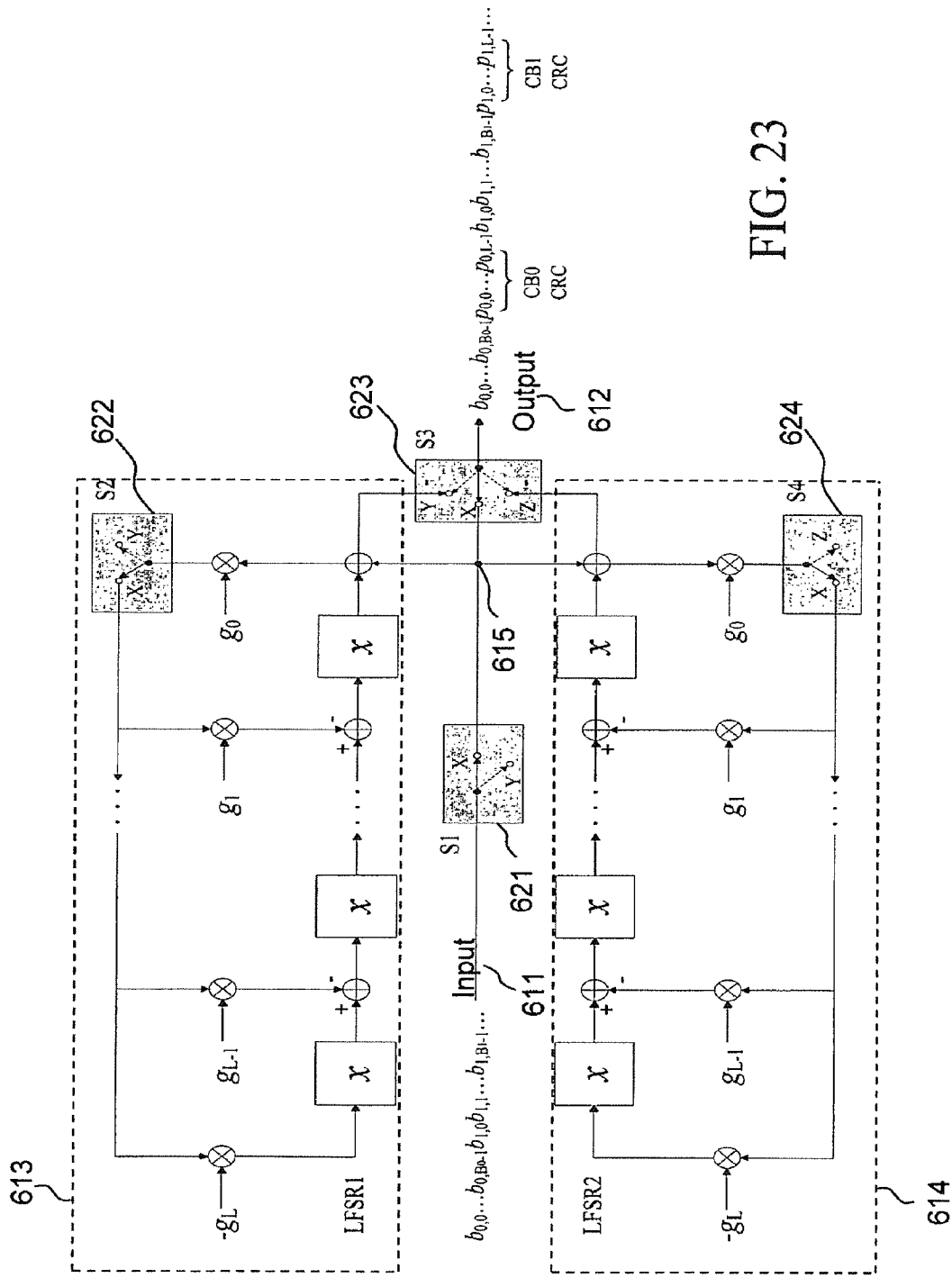
FIG. 23 schematically illustrates a CRC computation circuit for multiple code blocks constructed as still another embodiment according to the principles of the present invention.

Another method to compute CRCs for multiple code blocks is to use two LFSRs according to a ninth embodiment of the principles of the present invention. As shown in FIG. 23, the circuit is constructed with an input port 611 for receiving information data, an output port 612 for outputting the information data and cyclic redundancy checks, a first LFSR unit 613 connected between input port 611 and output port 612, and including L shift registers, a second LFSR unit 614 connected between input port 611 and output port 612, being in parallel with first FLSR unit 613, and comprising L shift registers. A first switch 621 is located between input port 611 and a common node 615 between first and second LFSR units 613 and 514. First switch has a position X for connecting input port 611 with common node 615, and a position Y for disconnecting input port 611 with common node 615. A second switch 622 is located at a feedback loop of first LFSR unit 613. Second switch 622 has a position X for connecting the feedback loop of first LFSR unit 613, and a position Y for disconnecting the feedback loop of first LFSR unit 613. A third switch 623 is located between input port 611, common node 615 between first and second LFSR units 613 and 614, and output port 612. Third switch 623 has a position X for connecting input port 611 with output port 612, a position Y for connecting first LFSR unit 613 and output port 612, and a position Z for connecting second LFSR unit 614 and output port 612. A fourth switch 624 is located a feedback loop of second LFSR unit 614. Fourth switch 624 has a position X for connecting the feedback loop of second LFSR unit 614, and a position Z for disconnecting the feedback loop of second LFSR unit 614. This method can be outlined as follows:

1. Initialize first LFSR unit 613 and second LFSR unit 614 to all-zero state; Set k=0; Set all switches 621, 622, 623 and 624 at position X.
2. Input $b_k(x)$ into the circuit via input port 611, one bit at a time. Note that both first LFSR unit 613 and second LFSR unit 614 are also shifted once for every bit input.
3. Change switch 621 to position Y.
4. If k=C−1, go to Step 8; Otherwise, change switches 622 and 623 to position Y.
5. Shift first LFSR unit 613 L times to obtain $p_k(x)$, which is the L-bit CRC for the k-th code block.
6. Change switches 621, 622 and 623 to position X; Reset first LFSR unit 613.
7. Increase k, go to Step 2.
8. Change switches 623 and 624 to position Z.
9. Shift second LFSR 614 L times to obtain $p_{C-1}(x)$, which is the L-bit CRC for the last code block.

This method computes the k-th code block CRC only based on information bits in the k-th code block, except the last code block. Therefore, the k-th code block CRC, except the last code block CRC, can be represented by:

$$p_k(x) = b_k(x) \cdot x^L - q_k(x) \cdot g(x), \text{ for } k=0,1,\ldots C-2, \quad (23)$$

where C is the total number of code blocks. The last code block CRC is computed by LFSR2 and is derived from information bits in all the code blocks. Therefore, the last code block CRC can be represented by:

$$p_k(x) = a_k(x) \cdot x^L - q_k(x) \cdot g(x), \text{ for } k=C-1. \quad (24)$$

Figure 24:
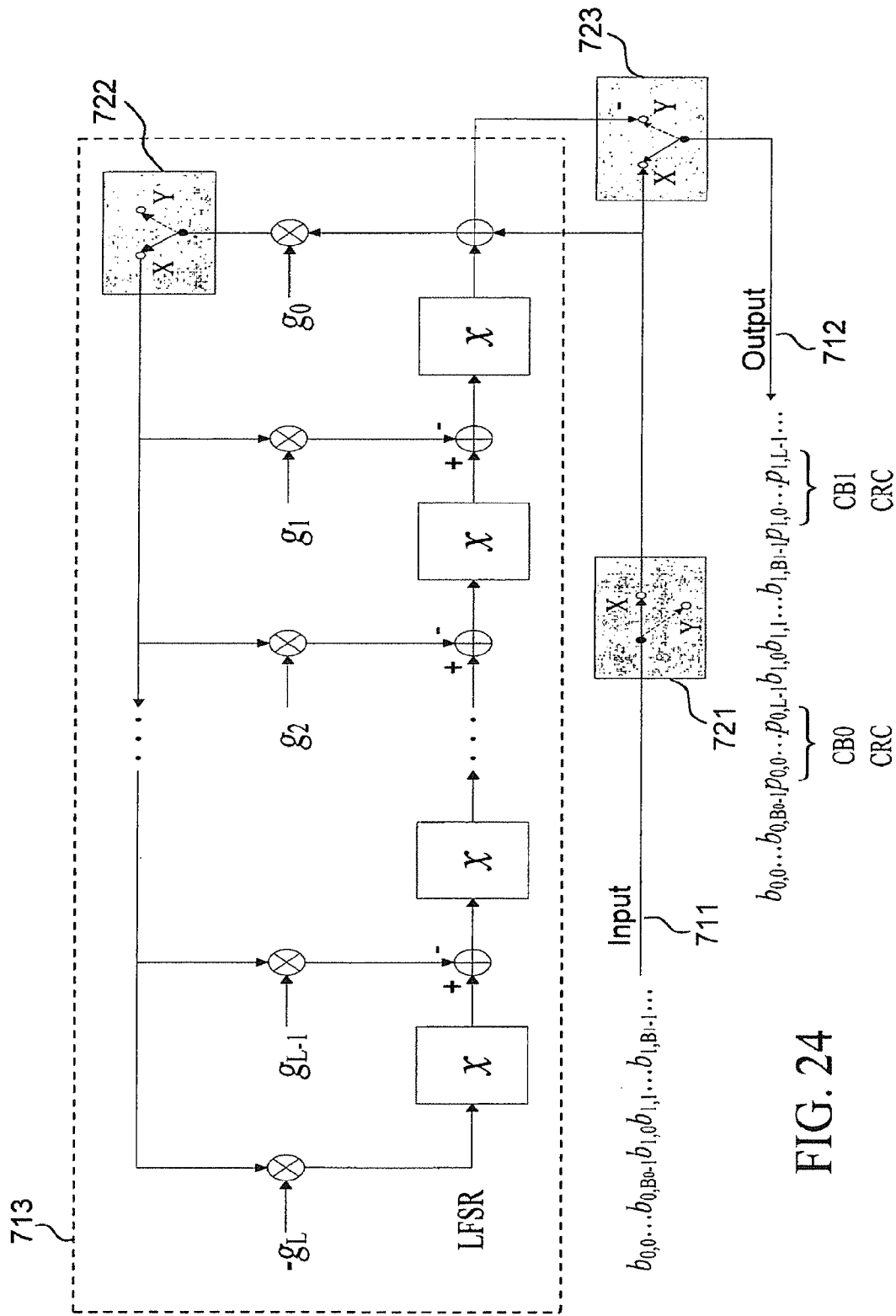
FIG. 24 schematically illustrates a CRC computation circuit for multiple code blocks constructed as a further embodiment according to the principles of the present invention.

Another method is to insert L 0's at the bit positions for all code block CRCs to the message a(x) before input a(x) to the CRC calculation circuit according to a tenth embodiment of the principles of the present invention. An example of this implementation is illustrated in FIG. 24. The circuit is constructed with an input port 711 for receiving information data, an output port 712 for outputting the information data and CRCs, and a LFSR unit 713 connected between input port 711 and output port 712, and including L shift registers for transforming the information data with a cyclic redundancy check generation polynomial g(x) having a degree of L−1. A first switch 721 is located between input port 711 and LFSR unit 713. First switch 721 has a position X for connecting input port 711 and LFSR unit 713, and a position Y for disconnecting input port 711 and LFSR unit 713. A second switch 722 is located at a feedback loop of LFSR unit 713. Second switch 722 has a position X for connecting the feedback loop of LFSR unit 713, and a position Y for disconnection the feedback loop of LFSR unit 713. A third switch 723 is located between input port 711, LFSR unit 713 and output port 712. Third switch 723 has a position X for connecting input port 711 with output port 712, and a position Y for connecting LFSR unit 713 and output port 713. Note that the L 0's is added implicitly by changing the switches' position from X to Y for L shifts. Essentially, in this case, we allow the initial state of the LFSR to be dependant on the previous code blocks and thus enabling the current CRC to protect the bits in the current code block and previous code blocks. This method can be outlined as follows:

1. Initialize LFSR unit 713 to all-zero state; Set k=0; Set all switches 721, 722 and 723 at position. X.
2. Input $b_k(x)$ into the circuit via input port 711, one bit at a time. Note the LFSR is also shifted once for every bit input.
3. Change all switches 721, 722 and 723 to position Y.
4. Shift LFSR unit 713 L times to obtain $p_k(x)$, which is the L-bit CRC for the k-th code block.
5. Change all switches to position X.
6. Increase k.
7. If k<C, go to Step 2.

While the invention has been shown and described in connection with the preferred embodiments, it will be apparent to those skilled in the art that modifications and variations can be made without departing from the spirit and scope of the invention as defined by the appended claims.

The invention claimed is:

1. A method for communication, comprising:
   calculating a transport block cyclic redundancy check (CRC) for all information bits to be delivered in a transport block;
   attaching the transport block CRC to the information bits to form the transport block;
   segmenting the transport block into a plurality of code blocks, wherein one of the code blocks includes the transport block CRC;
   for each of the code blocks produced by segmenting the transport block, calculating a code block CRC for all bits within the respective code block and attaching the code block CRC to the respective code block; and
   transmitting each of the code blocks and the attached code block CRC.

2. The method of claim 1, further comprising:
   attaching the transport block CRC to an end of the information bits, wherein a last code block produced by segmenting the transport block contains the transport block CRC.

3. The method of claim 1, further comprising:
   segmenting the transport block into code blocks when the number of bits of the transport block is more than Z bits.

4. The method of claim 1, wherein the transport block CRC comprises L parity bits.

5. The method of claim 1, wherein each code block CRC comprises L parity bits.

6. The method of claim 1, further comprising transmitting each of the code blocks and the attached code block CRC in an uplink communication transmission by a user equipment.

7. The method of claim 1, further comprising transmitting each of the code blocks and the attached code block CRC in an downlink communication transmission by a base station.

8. The method of claim 1, wherein the transport block CRC is transmitted within the one code block.

9. A communication apparatus, comprising:
   a first cyclic redundancy check (CRC) calculator configured to calculate a transport block cyclic redundancy check (CRC) for all information bits to be delivered in a transport block;
   one or more registers configured to attach the transport block CRC to the information bits to form the transport block;
   a segmentation unit configured to segment the transport block into a plurality of code blocks, wherein one of the code blocks includes the transport block CRC;
   a second CRC calculator configured to calculate, for each of the code blocks produced by segmenting the transport block, a code block CRC for all bits within the respective code block and attaching the code block CRC to the respective code block; and
   a transmitter configured to transmit each of the code blocks and the attached code block CRC.

10. The apparatus of claim 9, wherein the transport block CRC is attached to an end of the information bits, and wherein a last code block produced by segmenting the transport block contains the transport block CRC.

11. The apparatus of claim 9, wherein the transport block is segmented into code blocks when the number of bits of the transport block is more than Z bits.

12. The apparatus of claim 9, wherein the transport block CRC comprises L parity bits.

13. The apparatus of claim 9, wherein each code block CRC comprises L parity bits.

14. The apparatus of claim 9, wherein each of the code blocks and the attached code block CRC are transmitted in an uplink communication transmission by a user equipment.

15. The apparatus of claim 9, wherein each of the code blocks and the attached code block CRC are transmitted in an downlink communication transmission by a base station.

16. The apparatus of claim 9, wherein the transport block CRC is transmitted within the one code block.

17. A method for communication, comprising:
   calculating a transport block cyclic redundancy check (CRC) for all information bits to be delivered in a transport block;
   attaching the transport block CRC to the information bits to form the transport block;
   if the transport block contains more than Z bits, segmenting the transport block into a plurality of code blocks, wherein one of the code blocks includes the transport block CRC;
   for each of the code blocks produced by segmenting the transport block, calculating a code block CRC for all bits within the respective code block and attaching the code block CRC to the respective code block; and
   transmitting each of the code blocks and the attached code block CRC.

18. The method of claim 17, further comprising:
   attaching the transport block CRC to an end of the information bits, wherein a last code block produced by segmenting the transport block contains the transport block CRC.

19. The method of claim 17, wherein the transport block CRC comprises L parity bits.

20. The method of claim 17, wherein each code block CRC comprises L parity bits.

21. The method of claim 17, further comprising transmitting each of the code blocks and the attached code block CRC in an uplink communication transmission by a user equipment.

22. The method of claim 17, further comprising transmitting each of the code blocks and the attached code block CRC in an downlink communication transmission by a base station.

23. The method of claim 17, wherein the transport block CRC is transmitted within the one code block.

* * * * *